(12) United States Patent
Ngu et al.

(10) Patent No.: US 12,732,117 B2
(45) Date of Patent: Sep. 8, 2026

(54) X-TYPE MULTILEVEL CONVERTER SYSTEMS INCLUDING INTERLEAVED TOPOLOGIES FOR MUTUAL INDUCTANCE CANCELLATION

(71) Applicant: GM GLOBAL TECHNOLOGY OPERATIONS LLC, Detroit, MI (US)

(72) Inventors: Benjamin S. Ngu, Rochester Hills, MI (US); Yilun Luo, Ann Arbor, MI (US); Khorshed Mohammed Alam, Canton, MI (US); Chandra S. Namuduri, Troy, MI (US); Rashmi Prasad, Troy, MI (US); Michael Z. Pieszala, Panama City, FL (US)

(73) Assignee: GM Global Technology Operations LLC, Detroit, MI (US)

( * ) Notice: Subject to any disclaimer, the term of this patent is extended or adjusted under 35 U.S.C. 154(b) by 114 days.

(21) Appl. No.: 18/991,801

(22) Filed: Dec. 23, 2024

(65) Prior Publication Data

US 2026/0180462 A1 Jun. 25, 2026

(51) Int. Cl.
*H02M 7/00* (2006.01)
*H02M 7/537* (2006.01)
(Continued)

(52) U.S. Cl.
CPC ........... *H02M 7/003* (2013.01); *H02M 7/537* (2013.01); *H05K 7/14329* (2022.08);
(Continued)

(58) Field of Classification Search
CPC .... H02M 3/1582; H02M 3/155; H02M 3/156; H02M 3/157; H02M 3/158;
(Continued)

(56) References Cited

U.S. PATENT DOCUMENTS 12,636,964 B2 * 5/2026 Farahmand ............. B60L 53/14
2010/0277958 A1 * 11/2010 Campbell ............. B60K 6/485 363/40

(Continued)

FOREIGN PATENT DOCUMENTS

DE 102023104213 A1 6/2024
DE 102023128172 A1 2/2025

(Continued)

*Primary Examiner* — Jeffrey A Gblende
(74) *Attorney, Agent, or Firm* — Quinn IP Law

(57) ABSTRACT

A multi-phase power inverter including a plurality of X-type multilevel power converters arranged to transfer electric power between a high-voltage direct current (DC) power supply and an electric machine. Each of the plurality of X-type multilevel power converters is configured as a solid-state integrated circuit (IC) including folded legs including a plurality of semiconductor switches, and clamping diodes. The plurality of semiconductor switches, a positive DC power bus, a negative DC power bus, a first AC bus, a second AC bus, a third AC bus, a fourth AC bus, and the clamping diodes are arranged into a plurality of tiers. Such that both the positive DC power bus and the negative DC power bus are parallel with the neutral bus generating mutual inductance cancellation that minimizes parasitic inductance by coupling positive mutual inductance and negative mutual inductance for commutation loop currents within each of the X-type multilevel converters.

20 Claims, 12 Drawing Sheets

(51) Int. Cl.
*H05K 7/14* (2006.01)
*H05K 7/20* (2006.01)
*B60L 50/51* (2019.01)

(52) U.S. Cl.
CPC .............. *H05K 7/209* (2013.01); *B60L 50/51* (2019.02); *B60L 2210/40* (2013.01)

(58) Field of Classification Search
CPC .. H02M 3/1584; H02M 3/1586; H02M 3/285; H02M 3/33561; H02M 7/49; H02M 1/045; H02M 7/006; H02M 7/06; H02M 7/068; H02M 7/153; H02M 7/10; H02M 1/083; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/007; H02M 1/0009; H02M 1/0095; H02M 1/08; H02M 1/088; H02M 3/1588; H02M 7/5395; H02M 1/14; H02M 1/0043; H02M 1/0074; H02M 1/0077; H02M 1/0045; H02M 1/0006; H02M 1/10; H02M 7/003; H02M 3/088; H02M 3/1566; H02M 3/003; H02M 3/33523; H02J 3/46; H02J 3/38; G06F 1/263; H01L 25/112; H01L 25/115; H01L 23/34; H01L 23/528; H01L 27/088; H01L 29/088; H01L 29/2003; H01L 23/49503; H01L 23/49562; H01L 23/49575; H01L 23/62; H01L 23/072; H01L 23/0248; H01L 29/1033; H01L 29/402; H01L 29/41758; H01R 13/6675; H01R 29/00; H01R 31/065; G09G 3/20; H02K 11/046; H01F 2027/406; H01F 27/30; H01F 41/0246; H05K 7/20927; H05K 2201/10166; H05K 2201/10507; H05K 7/2089; H05K 7/14329; H05K 7/1432; H05K 7/14327; H05K 7/14
See application file for complete search history.

(56) References Cited

U.S. PATENT DOCUMENTS

| | | | | |
|---|---|---|---|---|
| 2015/0236634 | A1* | 8/2015 | Han .......................... | H02P 5/74 318/504 |
| 2023/0238895 | A1 | 7/2023 | Moon | |

FOREIGN PATENT DOCUMENTS

| | | | |
|---|---|---|---|
| DE | 102024100712 | A1 | 5/2025 |
| DE | 102024100713 | A1 | 5/2025 |

* cited by examiner 120
100
120
20
120
114
12
10
121
122
104
108
30
36
34
32
102
103
+
−
100
101
Fig−1

120
114
12
108
10
121
122
150
111
150
111
150
111
104
110
112
105
102
101
103

150
110
111
112
S1, 151
S2, 152
S3, 153
S4, 154
$V_{O1}$
121
161
162
163
D1, 171
D2, 172
164
165
166
S5, 155
S6, 156
S7, 157
S8, 158
$V_{O2}$
122
102
103
105

150A
5B
5C
102, 110A
150A-1
149A
103, 112A
149A
S5, 155
147A
S6, 156
D1, 171
190
121A
S1, 154
148A
S3, 153
180A
122A
P1
P2
P3
150A-2

102, 110A
180A-1
142A
146A
S5, 155
147A
S6, 156
180A-2
D1, 171
180A
T1-A
T2-A
T3-A
121A 103, 112A
S1, 154
S3, 153
T1-A
T2-A
T3-A
122A 6B
6C
250A
250A-1
249A
102, 210A
103, 212A
S5, 255
S4, 254
247A
248A
S6, 256
249A
S3, 253
D1, 271
190
221A
280A
190
222A
P1
250A-2
P2
P3

6B
6C
102, 210A
280A-1
242A
246A
249A
S2, 255
247A
249A
S6, 256
246A
D1, 171
246A
280A
280A-2
T1-A
T2-A
221A
T3-A 103, 212A
280A-1
242A
246A
249A
S4, 254
248A
249A
S3, 253
246A
280A-2
246A
D1, 271
246A
T3-A
T2-A
280A
222A
T1-A 6E
6F
250B
250B-1
249B
102, 210B
103, 212B
S1, 251
S8, 258
247B
248B
S2, 252
249B
S7, 257
D2, 272
290
222B
280B
290
221B
P1
P2
P3
250B-2

6E
6F
102, 210B
280B-1
242B
246B
249B
S1, 251
247B
249B
S6, 256
246B
D2, 172
246B
280B
280B-2
T1-B
T2-B
222B
T3-B 103, 212B
280B-1
246B
242B
249B
S8, 258
248B
249B
S7, 257
246B
D2, 272
246B
280B-2
T2-B
T3-B
280B
221B
T1-B 7E
7F
350B
350B-1
349B-2
102, 310B
103, 312B
349B-1
349B-3
347B-1
S1, 351
S8, 358
347B
348B
D2, 372
S2, 352
S7, 357
349B-1
349B-3
347B-2
349B-2
390
390
380B
322B
321B
P1
P2
P3
350B-2
7E
7F 102, 310B
380B-1
342B
349B
S1, 351
347B-2
346B
347B
D2, 372
346B
T3-B
S2, 352
347B-1
349B
T2-B
380A
380B-2
322B
T1-B 103, 312B
380B-1
342B
349B
S8, 358
346B
348B
346B
D2, 372
S7, 357
349B
T2-B
380B-2
380B
321B
T1-B 450A
8B
8C
450A-1
449A
102, 410A
103, 412A
447A-1
S5, 455
S4, 454
448A
447A
D1, 471
S6, 456
S3, 453
447A-2
449A
490
490
421A
480A
422A
P1
P2
P3
450A-2

102, 410A
480A-1
442A
449A
S5, 455
447A-2
D1, 471
446A
447A
D1, 471
T3-A
S6, 456
449A
447A-1
T2-A
480A
480A-2
421A
T1-A 103, 412A
480A-1
449A
442A
S4, 454
448A
D1, 471
446A
D1, 471
S3, 453
449A
T2-A
T1-A
480A-2
480A
422A
T1-A

X-TYPE MULTILEVEL CONVERTER SYSTEMS INCLUDING INTERLEAVED TOPOLOGIES FOR MUTUAL INDUCTANCE CANCELLATION

INTRODUCTION

The concepts described herein relate generally to vehicles employing electrified powertrain or propulsion systems, which are composed with direct current (DC) power supplies that provide DC electric power, which is converted to alternating current (AC) electric power via multi-phase power inverters, to control operation of one or multiple electric machines.

High-voltage and high-power multilevel inverters (MLIs) have gained attention as the transportation electrification trend of consumer and commercial vehicles is rapidly expanding towards high-capacity mass transit systems such as electric aircraft, trains, and ships. MLIs such as neutral point clamped (NPC) and X-type inverters provide high-voltage and high-power operation capabilities but include stacked DC-link capacitors with a neutral point connection for zero voltage vector. This neutral point connection to the stacked DC-link capacitor may generate a neutral current oscillating at three times the fundamental frequency, which may cause capacitor voltage imbalance and overvoltage stress on capacitors and switching devices.

A multi-phase power inverter circuit may generate an inherent power loop in which high current flows from a DC-link capacitor to a high-side (HS) of the multilevel power inverter, then to a low-side (LS) of the multilevel power inverter and back. The power loop may generate magnetic fields, and form parasitic loop inductance.

The current flow path determines the size of the power loop, which determines the size of the magnetic field generated, and hence the size of the parasitic inductance. The current flow path is defined by the topology of the circuit, and therefore the topology of the circuit may affect the size of the parasitic loop inductance and stray inductance.

SUMMARY

In view of the above discussion, it is useful to develop a system of integrating power semiconductor devices including selective active and passive vertical and/or lateral semiconductor dies to effect mutual inductance cancellation for a multi-phase power inverter including a plurality of X-type multilevel power converters having an interleaved topology that reduces parasitic inductance within the multi-phase power inverter and/or within each X-type multilevel power converter.

The concepts disclosed herein relate to a system for a multi-phase power inverter including a plurality of X-type multilevel power converters having interleaved topologies that may achieve mutual inductance cancellation.

The interleaved topologies pair semiconductor switches, and their respective buses on top or adjacent to one another coupling the positive bus (P bus) and the negative bus (N bus), and synchronizing the switching of the semiconductor switch pairs to cancel their electromagnetic fields to reduce their inductances including parasitic loop and stray inductances, bearing current, motor insulation voltage, and electromagnetic interference (EMI).

The interleaved topologies may reduce the gate loop, the power commutation loop, and the overall loop area of the X-type multilevel power converter, which may reduce the parasitic inductance, switching losses, ringing and decrease device stress.

Such a system may be used in vehicles having an electrified propulsion system, for example, but not limited to, a motor vehicle having an electrified powertrain or propulsion system, e.g., an electric vehicle (EV) or plug-in hybrid electric vehicle (PHEV), or another mobile platform, which may be powered by an electric propulsion system, to reduce parasitic inductance within the multi-phase power inverter.

Each multi-phase power inverter may include a plurality of X-type multilevel power converters arranged between a high-voltage direct current (DC) power source and an electric machine. The number of X-type multilevel power converters required is application specific.

Each X-type multilevel power converter may be configured as a solid-state integrated circuit (IC) that includes a plurality of circuit components, for example, but not limited to semiconductor switches and busbars, which are connected to form a network of interconnections through which current may flow. The form of this network of interconnected circuitry is called a circuit topology.

Interleaved circuit topologies may be used to connect multiple inverters and/or converters to achieve system-level goals, for example but not limited to reduced parasitic inductance within an X-type multilevel power converter and/or a multi-phase power inverter.

Ceramics, a printed control board (PCB), or cold plate may be included between folded legs of the X-type multilevel power converter to provide double-sided and/or single-sided cooling of the X-type multilevel power converter.

The concepts described herein provide a multi-phase power inverter that is advantageously arranged to minimize stray inductance and loop inductance employing magnetic field cancellation. This includes using cancelling fields by arranging positive, neutral and negative buses and a plurality of X-type multilevel power converters arranged in solid-state integrated circuits having laterally sectioned elements. The arrangement of the X-type multilevel power converters with laterally sectioned elements enables either single-sided or double-sided cooling to reduce thermal impedance. This configuration may serve to reduce stray inductance, thus leading to lower switching loss, less ringing, less electromagnetic interference (EMI), and lower device thermal stress.

A multi-phase power inverter may include a plurality of X-type multilevel power converters arranged to transfer electric power between a high-voltage direct current (DC) power source and an electric machine. Each of the plurality of X-type multilevel power converters may be configured as a solid-state integrated circuit (IC) that may include a first leg, and a second leg.

Each of the first leg and the second leg may include a positive DC power bus, a negative DC power bus, a neutral bus, a first alternating current (AC) bus, a second AC bus, a first conductive layer, and a second conductive layer.

An X-type multilevel converter may include a first leg, a second leg, power module substrates, and heat sinks. Each of the first leg and the second leg may be arranged adjacent to respective first sides of the power module substrates. Each of the heat sinks may be arranged adjacent to respective second sides of the power module substrates.

The first leg may be connected to the second leg by interconnection(s), which may include one or more interconnection(s) that electrically connect the first leg and the second leg.

A first leg of an X-type multilevel power converter may be arranged adjacent to a first side of a power module substrate. A second leg of the X-type multilevel power converter may be arranged adjacent to a first side of a power module substrate.

The first leg and the second leg may include a plurality of semiconductor switches disposed in a tiered arrangement on the power module substrates.

The plurality of semiconductor switches may include a first semiconductor switch, a second semiconductor switch, a third semiconductor switch, a fourth semiconductor switch, a fifth semiconductor switch, a sixth semiconductor switch, a seventh semiconductor switch, and an eighth semiconductor switch.

The first leg of the X-type multilevel power converter may include a positive DC power bus, a negative DC power bus, a first alternating current (AC) bus, a second AC power bus, a first clamping diode, a first conductive layer, a second conductive layer, a first power module substrate, a first heat sink adjacent to a second side of the first power module substrate, a first plurality of semiconductor switches including the third semiconductor switch, the fourth semiconductor switch, the fifth semiconductor switch and the sixth semiconductor switch, and a first plurality of conductive spacers.

The first plurality of conductive spacers may be arranged between the fifth semiconductor switch and the positive DC power bus, the sixth semiconductor switch and the first AC bus, the fourth semiconductor switch and the second conductive layer, the third semiconductor switch and the second conductive layer, and the first clamping diode and the second conductive layer.

The first plurality of semiconductor switches, the first leg positive DC power bus, the first leg negative DC power bus, the first leg first AC bus, the first leg second AC bus, the first leg first conductive layer, the first leg second conductive layer, and the first clamping diode may be arranged into a plurality of tiers including a first tier, a second tier, and a third tier.

The first tier may be composed of the first leg first conductive layer arranged coplanar with the first leg first negative DC power bus that may be arranged coplanar with the first leg second AC bus.

The second tier may be composed of the first clamping diode arranged coplanar with the third semiconductor switch arranged coplanar with the fourth semiconductor switch that may be arranged coplanar with the fifth semiconductor switch that may be arranged coplanar with the sixth semiconductor switch.

The third tier may be composed of the first leg second conductive layer arranged coplanar with the first leg first positive DC power bus that may be arranged coplanar the first leg first AC bus.

The second leg of the X-type multilevel power converter may include a positive DC power bus, a negative DC power bus, a first AC bus, a second AC power bus, a first clamping diode, a first conductive layer, a second conductive layer, a first power module substrate, a first heat sink adjacent to a second side of the first power module substrate, a second plurality of semiconductor switches including the first semiconductor switch, the second semiconductor switch, the seventh semiconductor switch, and the eighth semiconductor switch, and a second plurality of conductive spacers.

The second plurality of conductive spacers may be arranged between the first semiconductor switch and the positive DC power bus, the second semiconductor switch and the second AC bus, the eighth semiconductor switch and the second conductive layer, the seventh semiconductor switch and the second conductive layer, and the second clamping diode and the second conductive layer.

The second plurality of semiconductor switches, the second leg positive DC power bus, the second leg negative DC power bus, the second leg first AC bus, the second leg second AC bus, the second leg first conductive layer, the second leg second conductive layer, and the second clamping diode may be arranged into a plurality of tiers including a first tier, a second tier, and a third tier.

The first tier may be composed of the second leg first conductive layer arranged coplanar with the second leg first negative DC power bus that may be arranged coplanar with the second leg second AC bus.

The second tier may be composed of the second clamping diode arranged coplanar with the first semiconductor switch that may be arranged coplanar with the second semiconductor switch that may be arranged coplanar with the seventh semiconductor switch that may be arranged coplanar with the eighth semiconductor switch.

The third tier may be composed of second leg second conductive layer arranged coplanar with the second leg first positive DC power bus that may be arranged coplanar to the second leg first AC bus.

According to one aspect of the disclosure, the multilevel power converter may include a first heat sink, and a second heat sink.

The first leg first conductive layer, the first leg negative DC power bus, and the first leg second AC bus may be arranged adjacent to the first side of the first power module substrate.

The first heat sink may be arranged adjacent to the second side of the first power module substrate.

The second leg first conductive layer, the second leg negative DC power bus, and the second leg second AC bus may be arranged adjacent to the first side of the second power module substrate.

The second heat sink may be arranged adjacent to the second side of the second power module substrate.

The fifth semiconductor switch, the sixth semiconductor switch, the first leg positive DC power bus, and the first leg first AC bus may be arranged on a first portion of the first power module substrate. The first clamping diode, and a first plurality of gate/source pins may be arranged on a second portion of the first power module substrate. The fourth semiconductor switch, the third semiconductor switch, the first leg negative DC bus, and the first leg second AC bus may be arranged on a third portion of the first power module substrate.

The first portion, the second portion, and the third portion of the first power module substrate may be coplanar. The second portion may be arranged between the first portion and the third portion.

The first semiconductor switch, the second semiconductor switch, the second leg positive DC power bus, and the second leg second AC bus may be arranged on a first portion of the second power module substrate. The second clamping diode, and a second plurality of gate/source pins may be arranged on a second portion of the second power module substrate. The eighth semiconductor switch, the seventh semiconductor switch, the second leg negative DC bus, and the second leg first AC bus may be arranged on a third portion of the second power module substrate.

The first portion, the second portion, and the third portion of the second power module substrate may be coplanar. The second portion may be arranged between the first portion and the third portion.

According to one aspect of the disclosure, the first plurality of gate/source pins and the second plurality of gate/source pins may be configured to pop out vertically from the first power module substrate and the second power module substrate respectively.

According to one aspect of the disclosure, the first leg positive DC power bus, the first leg negative DC power bus, the second leg positive DC power bus, and the second leg negative DC power bus may be arranged at a first end of the X-type multilevel power converter. The first leg first AC bus, the first leg second AC bus, the second leg first AC bus, and the second leg second AC bus may be arranged at a second end of the X-type multilevel power converter.

According to one aspect of the disclosure, each of the first plurality of semiconductor switches and the second semiconductor switches may include a single die.

According to one aspect of the disclosure, each single die may include a vertical device.

According to one aspect of the disclosure, each of the first plurality of semiconductor switches and the second semiconductor switches includes a plurality of dies.

According to one aspect of the disclosure, each plurality of dies includes a vertical device.

The first leg and the second leg of the X-type multilevel power converter may be electrically connected by interconnections arranged between the first AC bus of the first leg and the first AC bus of the second leg, and the second AC bus of the first leg and the second AC bus of the second leg.

According to another aspect of the disclosure, a first leg of an X-type multilevel power converter may be arranged adjacent to a first side of a power module substrate. A second leg of the X-type multilevel power converter may be arranged adjacent to a first side of a power module substrate.

The first leg and the second leg may include a plurality of semiconductor switches disposed in a tiered arrangement on the power module substrates.

The plurality of semiconductor switches may include a first semiconductor switch, a second semiconductor switch, a third semiconductor switch, a fourth semiconductor switch, a fifth semiconductor switch, a sixth semiconductor switch, a seventh semiconductor switch, and an eighth semiconductor switch.

The first leg of the X-type multilevel power converter may include a positive DC power bus, a negative DC power bus, a first alternating current (AC) bus, a second AC power bus, a first clamping diode, a first conductive layer, a second conductive layer, a first power module substrate, a first heat sink adjacent to a second side of the first power module substrate, a first plurality of semiconductor switches including the third semiconductor switch, the fourth semiconductor switch, the fifth semiconductor switch, the sixth semiconductor switch, and a first plurality of conductive spacers.

The first plurality of conductive spacers may be arranged between the first clamping diode and a first portion of the first conductive layer.

The first plurality of semiconductor switches, the first leg positive DC power bus, the first leg negative DC power bus, the first leg first AC bus, the first leg second AC bus, the first leg first conductive layer, the first leg second conductive layer, and the first clamping diode may be arranged into a plurality of tiers including a first tier, a second tier, and a third tier.

The first tier may be composed of the first leg first AC bus arranged coplanar with the first leg second AC bus that may be arranged coplanar with the first portion of the first leg first conductive layer that may be arranged coplanar with the first leg first positive DC power bus that may be arranged coplanar with the first leg negative DC power bus.

The second tier may be composed of the first clamping diode arranged coplanar with the third semiconductor switch that may be arranged coplanar with the fourth semiconductor switch that may be arranged coplanar with the fifth semiconductor switch that may be arranged coplanar with the sixth semiconductor switch.

The third tier may be composed of a second portion of the first leg first conductive layer.

The second leg of the X-type multilevel power converter may include a positive DC power bus, a negative DC power bus, a first AC bus, a second AC power bus, a second clamping diode, a first conductive layer, a second conductive layer, a first power module substrate, a first heat sink adjacent to a second side of the first power module substrate, a second plurality of semiconductor switches including the first semiconductor switch, the second semiconductor switch, the seventh semiconductor switch, and the eighth semiconductor switch, and a second plurality of conductive spacers.

The second plurality of conductive spacers may be arranged between the second clamping diode and the first conductive layer.

The second plurality of semiconductor switches, the second leg positive DC power bus, the second leg negative DC power bus, the second leg first AC bus, the second leg second AC bus, the second leg first conductive layer, the second leg second conductive layer, and the second clamping diode may be arranged into a plurality of tiers including a first tier, a second tier, and a third tier.

The first tier may be composed of the second leg first AC bus and may be arranged coplanar with the second leg second AC bus that may be arranged coplanar with the first portion of the second leg first conductive layer that may be arranged coplanar with the second leg positive DC power bus that may be arranged coplanar with the second leg negative DC power bus.

The second tier may be composed of the second clamping diode arranged coplanar with the first semiconductor switch that may be arranged coplanar with the second semiconductor switch that may be arranged coplanar with the seventh semiconductor switch that may be arranged coplanar with the eighth semiconductor switch.

The third tier may be composed of a second portion of the second leg first conductive layer.

According to one aspect of the disclosure, the multilevel power converter may include a first heat sink, and a second heat sink.

The first leg first conductive layer, the first leg negative DC power bus, and the first leg second AC bus may be arranged adjacent to the first side of the first power module substrate.

The first heat sink may be arranged adjacent to the second side of the first power module substrate.

The second leg first conductive layer, the second leg negative DC power bus, and the second leg second AC bus may be arranged adjacent to the first side of the second power module substrate.

The second heat sink may be arranged adjacent to the second side of the second power module substrate.

The fifth semiconductor switch, the sixth semiconductor switch, a first portion of a first plurality of gate/source pins, the first leg first AC bus, and the first leg positive DC power bus may be arranged on a first portion of the first power module substrate. The first clamping diode, and a second portion of the first plurality of gate/source pins may be arranged on a second portion of the first power module substrate. The third semiconductor switch, the fourth semiconductor switch, a third portion of the first plurality of gate/source pins, the first leg second AC bus, and the first leg negative DC power bus may be arranged on a third portion of the first power module substrate.

The first portion, the second portion, and the third portion of the first power module substrate may be coplanar. The second portion may be arranged between the first portion and the third portion.

The first semiconductor switch, the second semiconductor switch, a first portion of the second plurality of gate/source pins, the second leg positive DC power bus, and the second leg second AC bus may be arranged on a first portion of the second power module substrate. The second clamping diode, and a second portion of the second plurality of gate/source pins may be arranged on a second portion of the second power module substrate. The eighth semiconductor switch, the seventh semiconductor switch, a third portion of the second plurality of gate/source pins, the second leg negative DC bus, and the second leg first AC bus may be arranged on a third portion of the second power module substrate.

The first portion, the second portion, and the third portion of the second power module substrate may be coplanar. The second portion may be arranged between the first portion and the third portion.

According to one aspect of the disclosure, the first plurality of gate/source pins and the second plurality of gate/source pins may be configured to pop out vertically from the first power module substrate and the second power module substrate respectively.

According to one aspect of the disclosure, the first leg positive DC power bus, the first leg negative DC power bus, the second leg positive DC power bus, and the second leg negative DC power bus may be arranged at a first end of the X-type multilevel power converter, and the first leg first AC bus, the first leg second AC bus, the second leg first AC bus, and the second leg second AC bus may be arranged at a second end of the X-type multilevel power converter.

According to one aspect of the disclosure, each of the first plurality of semiconductor switches and the second semiconductor switches includes a single die.

According to one aspect of the disclosure, each single die includes a lateral device.

According to one aspect of the disclosure, each of the first plurality of semiconductor switches and the second semiconductor switches includes a plurality of dies.

According to one aspect of the disclosure, each of the plurality of dies includes a lateral device.

The first leg and the second leg of the X-type multilevel power converter may be electrically connected by interconnections that may be arranged between the first AC bus of the first leg and the first AC bus of the second leg, and the second AC bus of the first leg and the second AC bus of the second leg.

By configuring the topology within each of the X-type multilevel converters as illustrated above, both the positive DC power bus and the negative DC power bus are parallel with the auxiliary or neutral bus generating mutual inductance cancellation that minimizes parasitic inductance by coupling positive mutual inductance and negative mutual inductance for commutation loop currents within each of the X-type multilevel converters.

Further, including clamping diodes internal to the X-type multilevel converter also reduces the commutation loop within the X-type multilevel converter.

The concepts and aspects of the disclosure described herein facilitate various heat transfer and cooling systems, including direct cooling, indirect cooling, immersive cooling, single-sided or double-sided cooling.

The above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes combinations and sub-combinations of the elements and features presented above and below.

BRIEF DESCRIPTION OF THE DRAWINGS

The accompanying drawings, which are incorporated into and constitute a part of this specification, illustrate implementations of the disclosure which, taken together with the description, serve to explain the principles of the disclosure.

4 including a plurality of semiconductor switches each having a single die, in accordance with one aspect of the disclosure.

Figure 4:
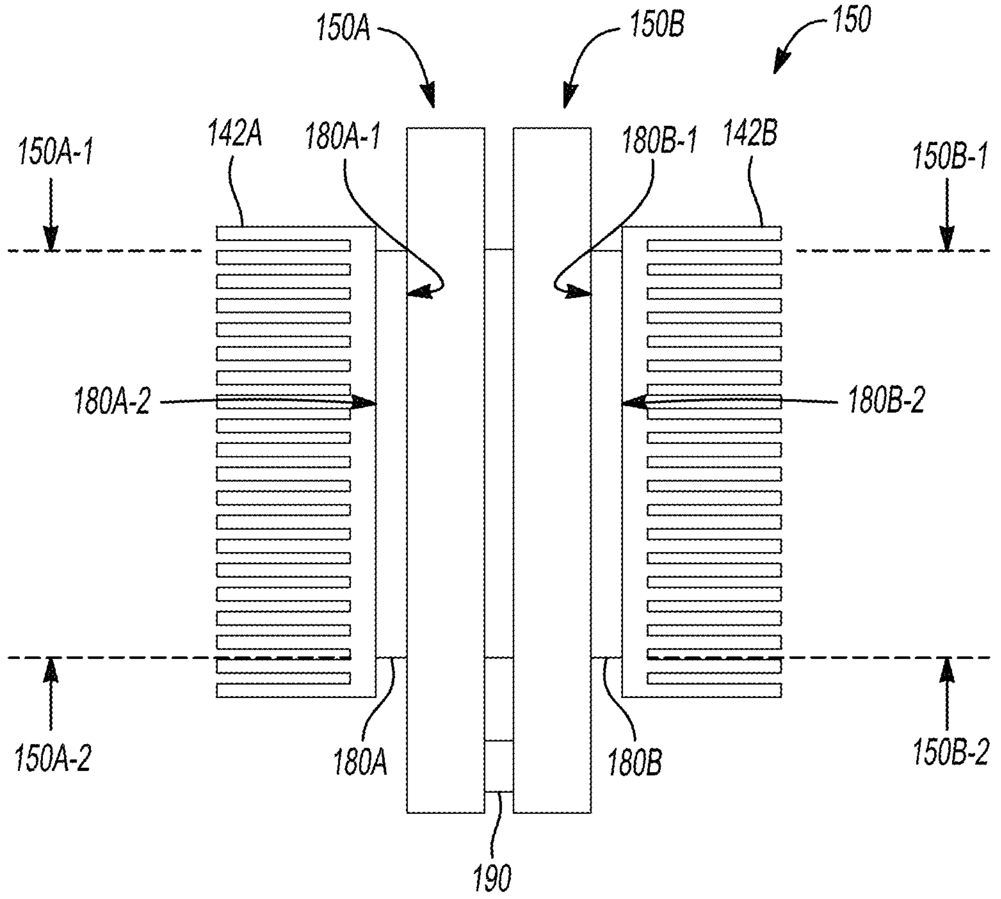
FIG. 4 schematically illustrates a side view of an X-type multilevel power converter having a first leg and a second leg, which is arranged as a solid-state IC.
Figures 6A, 6B, 6C:
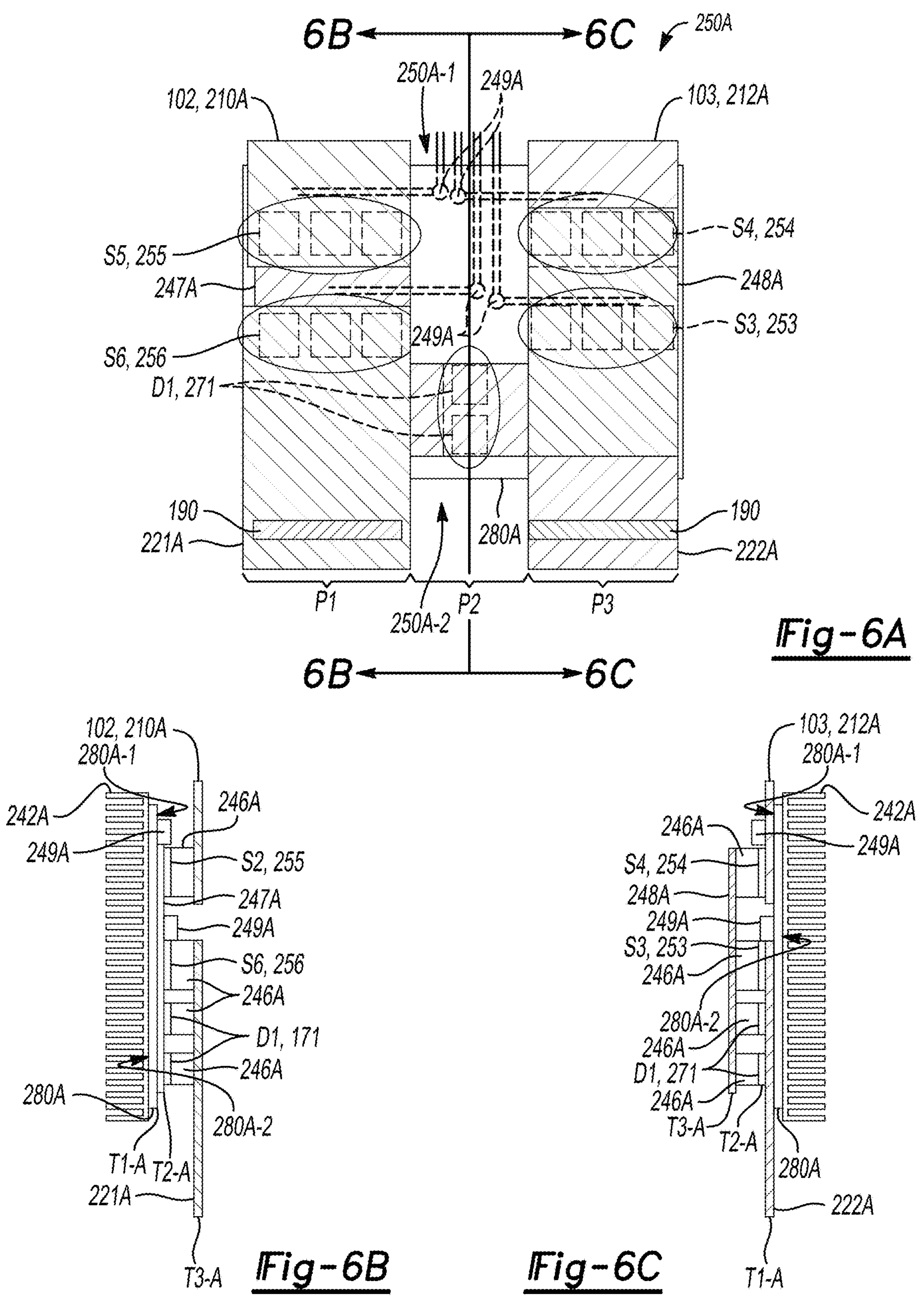

FIG. 6A schematically illustrates a plan view of a first leg of an X-type multilevel power converter schematically illustrated in FIG. 4 including a plurality of semiconductor switches each having a plurality of dies, in accordance with one aspect of the disclosure.

FIG. 6B schematically illustrates a sectional side view of the first leg through section B-B of FIG. 6A of the X-type multilevel power converter schematically illustrated in FIG. 4 including a plurality of semiconductor switches each having a plurality of dies, in accordance with one aspect of the disclosure.

FIG. 6C schematically illustrates a sectional side view of the first leg through section C-C of FIG. 6A of the X-type multilevel power converter schematically illustrated in FIG. 4 including a plurality of semiconductor switches each having a plurality of dies, in accordance with one aspect of the disclosure.

Figures 6D, 6E, 6F:
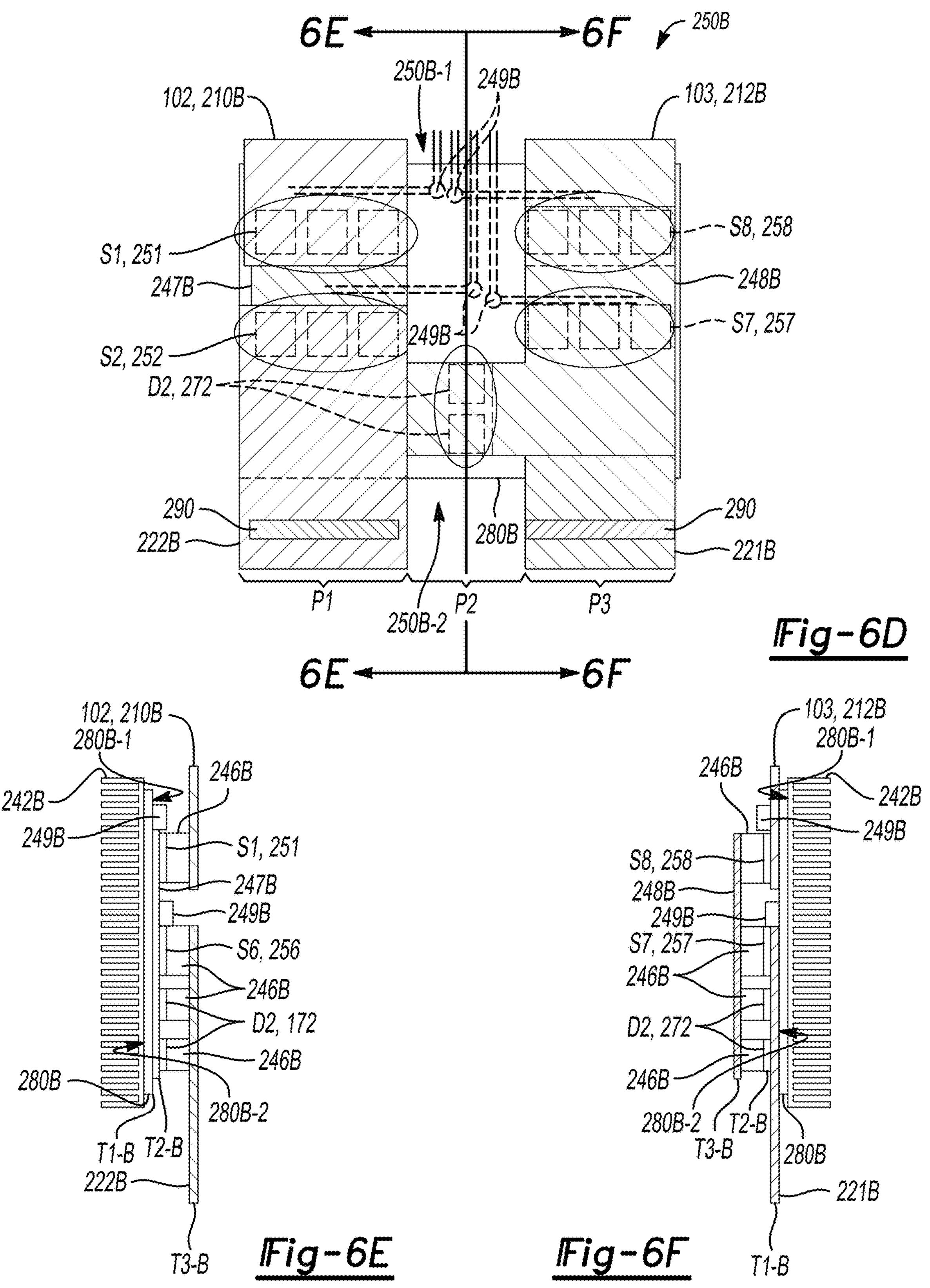

FIG. 6D schematically illustrates a plan view of a second leg of a X-type multilevel power converter schematically illustrated in FIG. 4 including a plurality of semiconductor switches each having a plurality of dies, in accordance with one aspect of the disclosure.

FIG. 6E schematically illustrates a sectional side view of the second leg through section E-E of FIG. 6D of the X-type multilevel power converter schematically illustrated in FIG. 4 including a plurality of semiconductor switches each having a plurality of dies, in accordance with one aspect of the disclosure.

FIG. 6F schematically illustrates a sectional side view of the second leg through section F-F of FIG. 6D of the X-type multilevel power converter schematically illustrated in FIG. 4 including a plurality of semiconductor switches each having a plurality of dies, in accordance with one aspect of the disclosure.

Figures 7A, 7B, 7C:
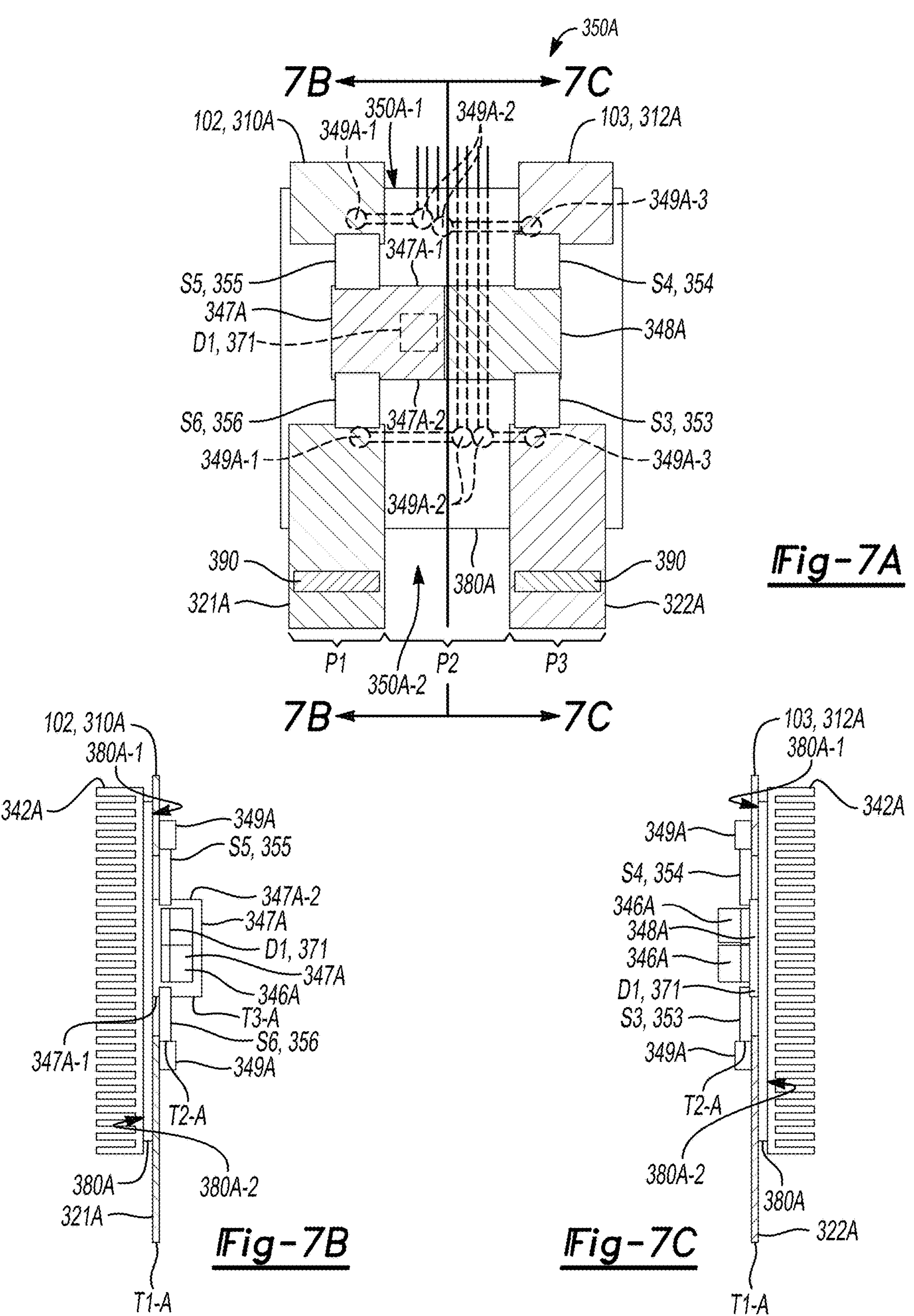

FIG. 7A schematically illustrates a plan view of a first leg of an X-type multilevel power converter schematically illustrated in FIG. 4 including a plurality of semiconductor switches each having a single die, in accordance with one aspect of the disclosure.

FIG. 7B schematically illustrates a sectional side view of the first leg through section B-B of FIG. 7A of the X-type multilevel power converter schematically illustrated in FIG. 4 including a plurality of semiconductor switches each having a single die, in accordance with one aspect of the disclosure.

FIG. 7C schematically illustrates a sectional side view of the first leg through section C-C of FIG. 7A of the X-type multilevel power converter schematically illustrated in FIG. 4 including a plurality of semiconductor switches each having a single die, in accordance with one aspect of the disclosure.

Figures 7D, 7E, 7F:
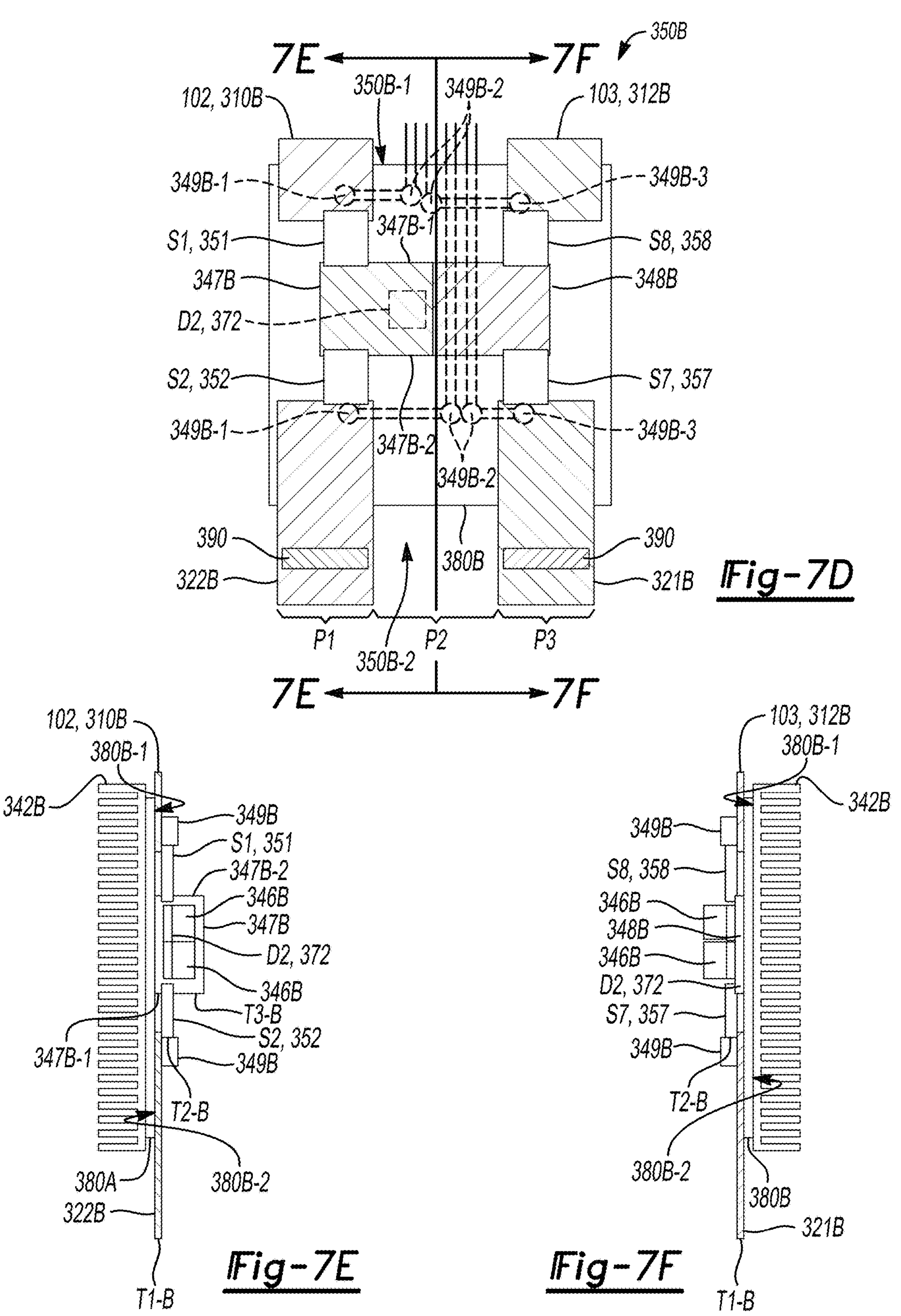

FIG. 7D schematically illustrates a plan view of a second leg of a X-type multilevel power converter schematically illustrated in FIG. 4 including a plurality of semiconductor switches each having a single die, in accordance with one aspect of the disclosure.

FIG. 7E schematically illustrates a sectional side view of the second leg through section E-E of FIG. 7D of the X-type multilevel power converter schematically illustrated in FIG. 4 including a plurality of semiconductor switches each having a single of die, in accordance with one aspect of the disclosure.

FIG. 7F schematically illustrates a sectional side view of the second leg through section F-F of FIG. 7D of the X-type multilevel power converter schematically illustrated in FIG. 4 including a plurality of semiconductor switches each having a single die, in accordance with one aspect of the disclosure.

Figures 8A, 8B, 8C:
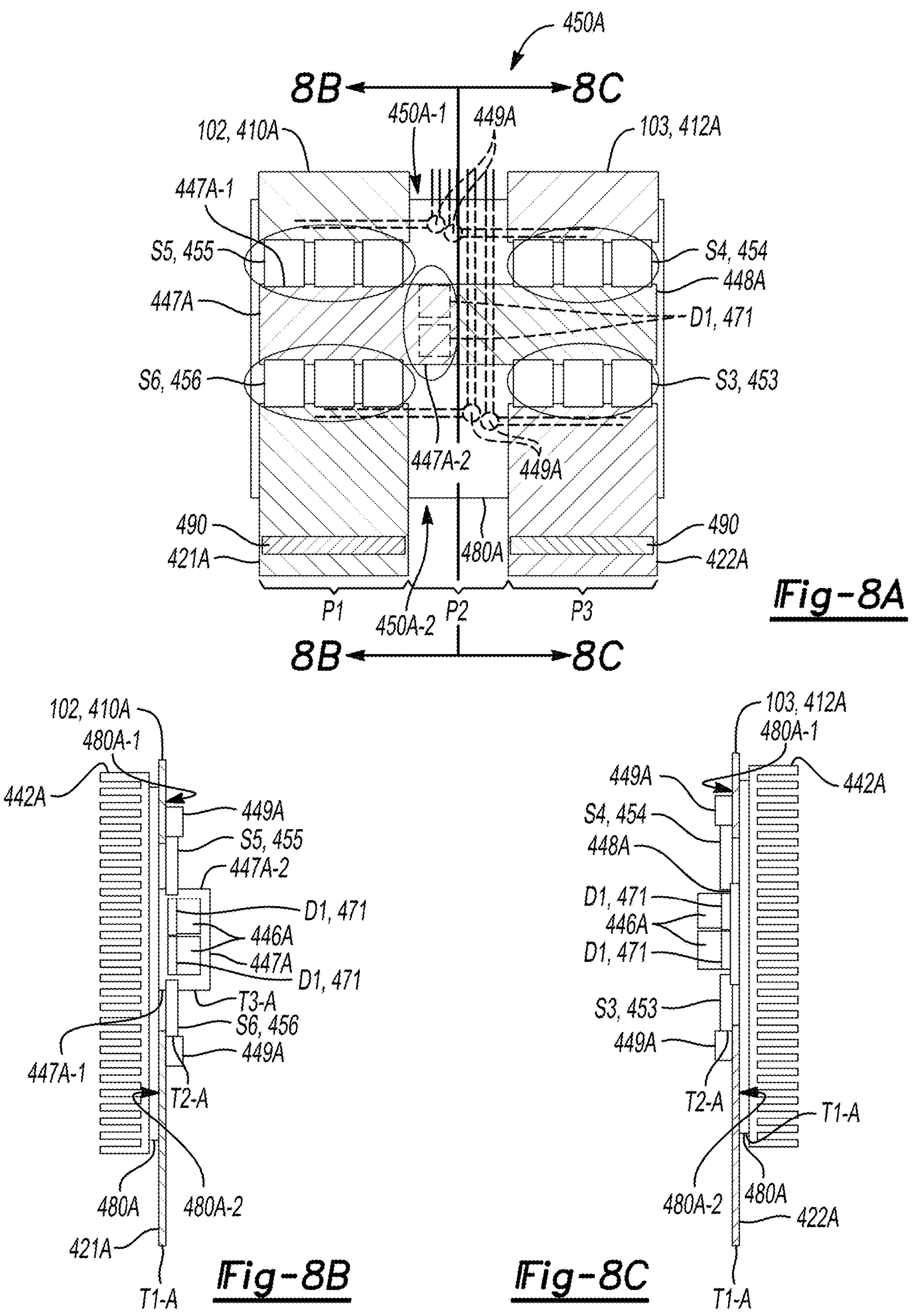

FIG. 8A schematically illustrates a plan view of a first leg of an X-type multilevel power converter schematically illustrated in FIG. 4 including a plurality of semiconductor switches each having a plurality of dies, in accordance with one aspect of the disclosure.

FIG. 8B schematically illustrates a sectional side view of the first leg through section B-B of FIG. 8A of the X-type multilevel power converter schematically illustrated in FIG. 4 including a plurality of semiconductor switches each having a plurality of dies, in accordance with one aspect of the disclosure.

FIG. 8C schematically illustrates a sectional side view of the first leg through section C-C of FIG. 8A of the X-type multilevel power converter schematically illustrated in FIG. 4 including a plurality of semiconductor switches each having a plurality of dies, in accordance with one aspect of the disclosure.

Figures 8D, 8E, 8F:
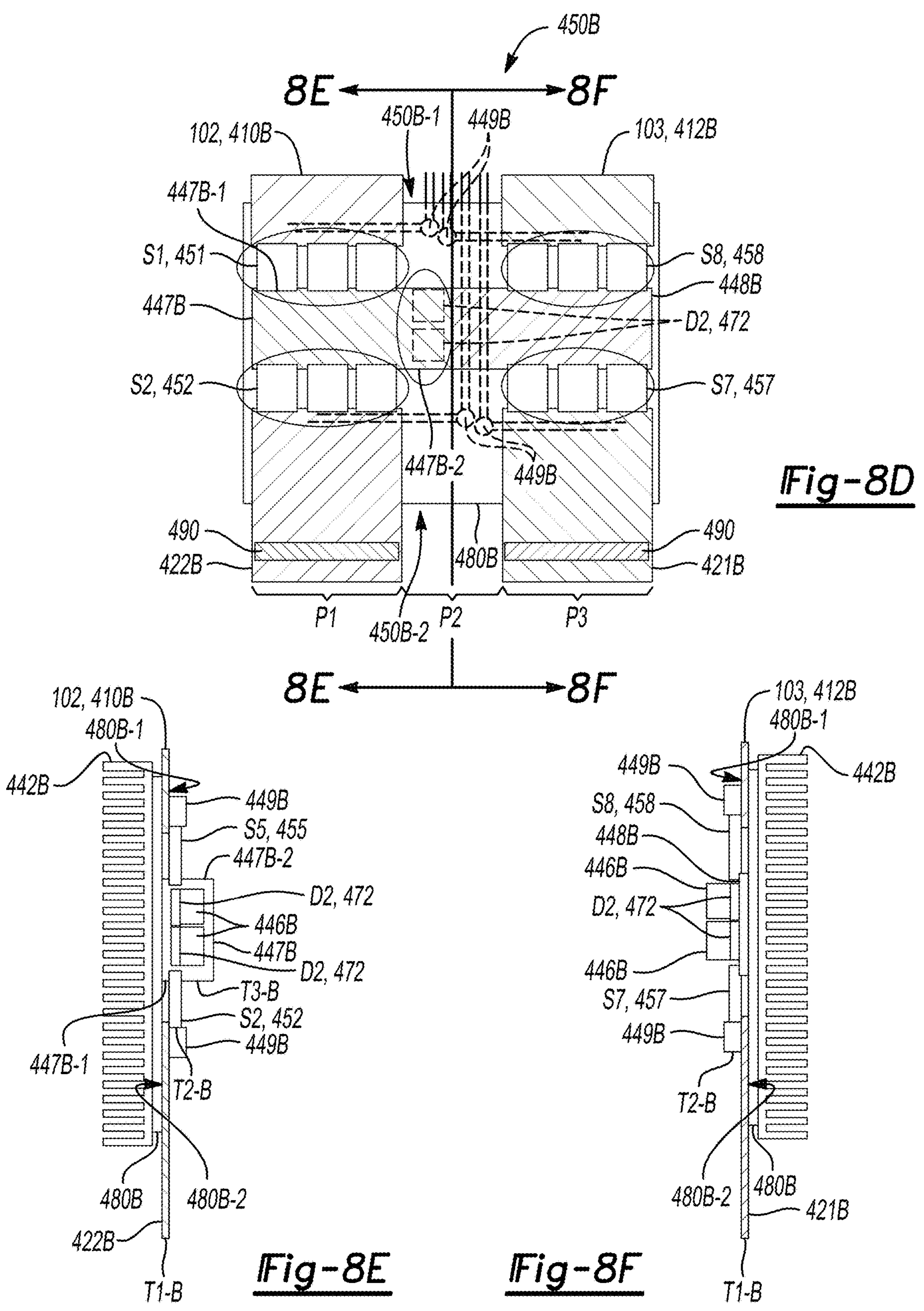

FIG. 8D schematically illustrates a plan view of a second leg of a X-type multilevel power converter schematically illustrated in FIG. 4 including a plurality of semiconductor switches each having a plurality of dies, in accordance with one aspect of the disclosure.

FIG. 8E schematically illustrates a sectional side view of the second leg through section E-E of FIG. 8D of the X-type multilevel power converter schematically illustrated in FIG. 4 including a plurality of semiconductor switches each having a plurality of dies, in accordance with one aspect of the disclosure.

FIG. 8F schematically illustrates a sectional side view of the second leg through section F-F of FIG. 8D of the X-type multilevel power converter schematically illustrated in FIG. 4 including a plurality of semiconductor switches each having a plurality of dies, in accordance with one aspect of the disclosure.

The appended drawings are not necessarily to scale and may present a somewhat simplified representation of various preferred features of the present disclosure as disclosed herein, including, for example, specific dimensions, orientations, locations, and shapes. Details adjacent to such features will be determined in part by the particular intended application and use environment.

DETAILED DESCRIPTION

The components of each aspect of the disclosure, as described and illustrated herein, may be arranged and designed in a variety of different configurations. Thus, the following detailed description is not intended to limit the scope of the disclosure, as claimed, but is merely representative of possible aspect of the disclosure thereof. In addition, while numerous specific details are set forth in the following description in order to provide a thorough understanding of each aspect of the disclosure disclosed herein, some aspects of the disclosure may be practiced without some of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein.

The present disclosure is susceptible to embodiment in many different forms. Representative examples of the disclosure are shown in the drawings and described herein in detail as non-limiting examples of the disclosed principles. To that end, elements and limitations described herein, but not explicitly set forth in the claims, are not to be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, and the words "including," "containing," "comprising," "having," and the like shall mean "including without limitation." Moreover, words of approximation such as "about," "almost," "substantially," "generally," "approximately," etc., may be used herein in the sense of "at, near, or nearly at," or "within 0-5% of," or "within acceptable manufacturing tolerances," or logical combinations thereof.

As used herein, the term "system" refers to mechanical and electrical hardware, software, firmware, electronic control componentry, processing logic, and/or processor device, individually or in combination, including without limitation: application specific integrated circuit (ASIC), an electronic circuit, a processor (shared, dedicated, or group) that executes one or more software or firmware programs, memory device(s) that electrically store software or firmware instructions, a combinatorial logic circuit, and/or other components that provide the described functionality.

As employed herein, terms such as "vertical", "horizontal", "left", "right", "upper", "lower", "top", "bottom" and similar expressions are non-limiting terms that merely describe the various elements as illustrated in the Figures and are not intended to limit the scope of the disclosure.

As used herein, the term "electric machine" refers to an electric motor/generator device including a rotor and a stator that is capable of converting electric power to mechanical power and/or converting mechanical power to electric power by electromagnetic effort.

Figure 1:
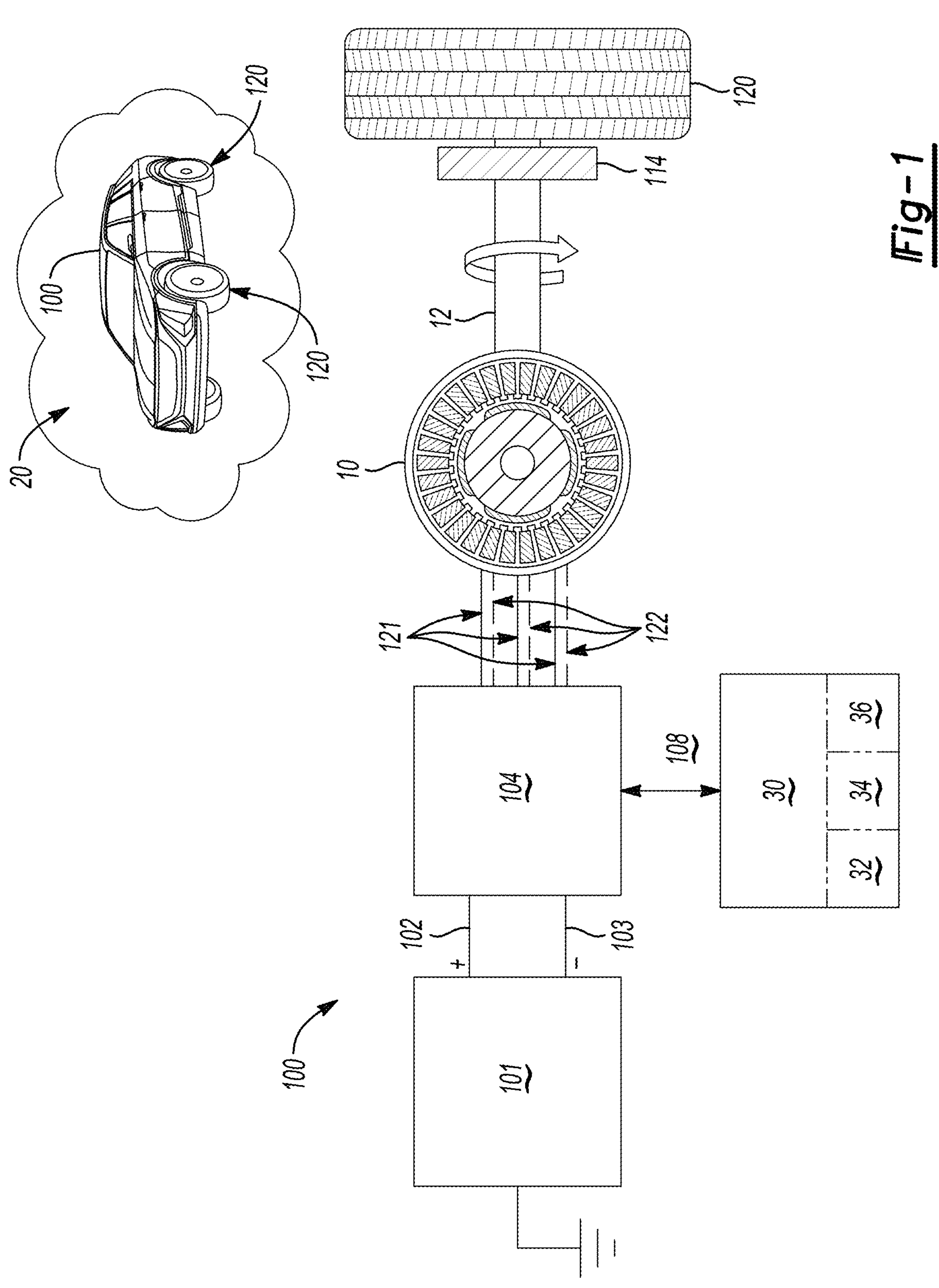
FIG. 1 schematically illustrates an electric drivetrain system including a multi-phase power inverter that is arranged between a high-voltage direct current (DC) power source and an electric machine, in accordance with the disclosure.
Figure 2:
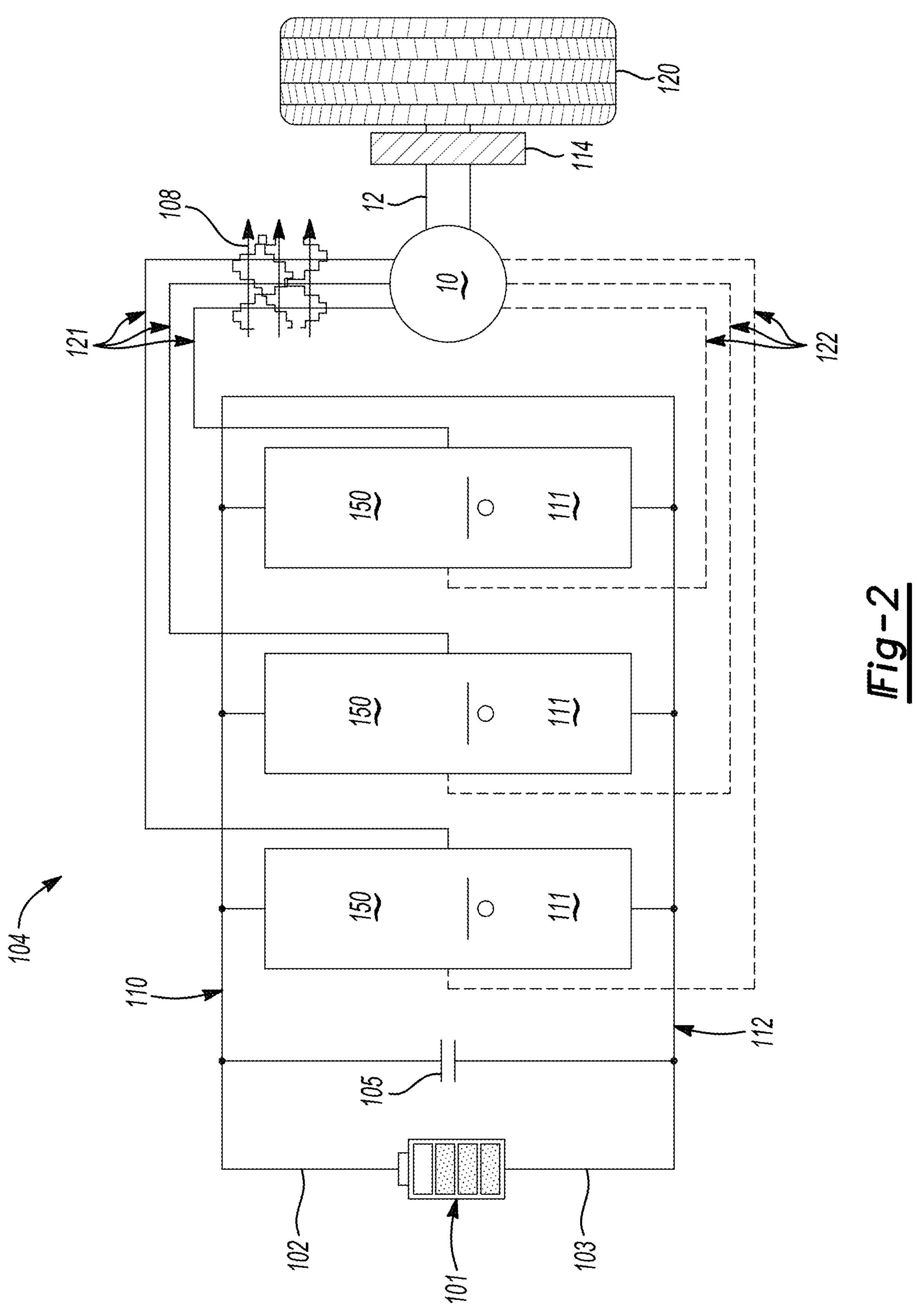
FIG. 2 schematically illustrates an electric drivetrain system including a multi-phase power inverter having a plurality of X-type multilevel power converters that are arranged between a high-voltage DC power source and an electric machine, in accordance with the disclosure.

Referring to the drawings, wherein like reference numbers refer to the same or like components in the several Figures, FIGS. 1 and 2 schematically illustrate an electric drivetrain 100 that is composed of a direct current (DC) power source 101, a multi-phase power inverter 104, a multi-phase rotary electric motor, generator, or motor-generator (electric machine) 10, and a torque actuator 120, the operations of which are monitored and controlled by a controller 30. In one aspect of the disclosure, the electric drivetrain 100 is arranged to generate and transfer torque to the torque actuator 120 in the form of one or multiple drive wheels to effect work. Controller 30 executes control routines to control and manage operation of the multi-phase power inverter 104. In one aspect of the disclosure, the electric drivetrain 100 is disposed on an electrified vehicle, schematically illustrated at 20, and capable of generating tractive torque for vehicle propulsion. When disposed on the electrified vehicle 20, the electrified vehicle 20 may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure. Alternatively, the electric drivetrain 100 may be an element of a stationary system.

The controller 30 may be embodied as one or more digital computing devices, and may include one or more processors 34 and memory 32. A control routine 36 may be stored as an executable instruction set in the memory 32 and executed by one of the processors 34 of the controller 30. The controller 30 is in communication with the multi-phase power inverter 104 to control operation thereof in response to execution of the control routine 36 to operate the electric machine 10. The multi-phase power inverter 104 exchanges or transfers electric power to the electric machine 10 via a plurality of first AC power buses 121 and second AC power buses 122.

The term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit (s), central processing unit(s), e.g., microprocessor(s) and associated memory component(s) in the form of transitory and/or non-transitory memory component(s) and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that may be accessed by one or more processors to provide a described functionality. Input/output circuit(s) and devices include analog/digital inverters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables.

The electric machine 10 includes a cylindrically-shaped rotor assembly arranged on a rotor shaft and disposed within an annularly-shaped stator, wherein the rotor assembly is coaxial with a rotor opening that is formed in the stator. Other elements of the electric machine 10, e.g., end caps, shaft bearings, electrical connections, etc., are included but not shown. Electrical windings of the stator are arranged with a quantity of electrical phases and a quantity of electrical turns per phase. Depending on the specific arrangement, the quantity of electrical phases may be between 3 and 6, and the quantity of layers of conductors may be between 4 and 12.

The multi-phase power inverter 104 includes a plurality of semiconductor switches (illustrated with reference to FIG. 3, et seq.) that are arranged and controllable to transform direct current (DC) electric power to alternating current (AC) electric power, and transform AC electric power to DC electric power, employing a pulse-width modulation signal 108 or another control technique. The multi-phase power inverter 104 is arranged and is controllable to transform DC electric power originating from the high-voltage DC power source 101 to AC electric power to actuate the electric machine 10 via electromagnetic effort. The electric machine 10 is controllable to rotate and generate mechanical torque that is transferred via a rotatable member 12 and a geartrain 114 to the torque actuator 120 when operating in a torque generating mode. The electric machine 10 is controllable to generate AC electric power from mechanical torque originating at the torque actuator 120 via electromagnetic effort, which is transformed by the multi-phase power inverter 104 to DC electric power for storage in the high-voltage DC power source 101 when operating in an electric power generating mode. The torque actuator 120 includes, in one aspect of the disclosure, a vehicle wheel that transfers torque to a ground surface to effect forward motion as part of a traction propulsion system. The high-voltage DC power source 101 may be in the form of a rechargeable electrochemical battery device, a fuel cell, an ultracapacitor, and/or another electrical energy storage/generation technology.

The high-voltage DC power source 101 may be a rechargeable electrochemical battery device, a fuel cell, an ultracapacitor, and/or another electrical energy storage/generation technology. The high-voltage DC power source 101 connects to the multi-phase power inverter 104 via a high-voltage DC bus having a positive link 102 and a negative link 103, and the multi-phase power inverter 104 connects to the electric machine 10 via a plurality of first AC power buses 121 and second AC power buses 122 to transfer the pulse-width modulation signal 108.

As illustrated with reference to FIG. 2, the multi-phase power inverter 104 of the electric drivetrain 100 is composed with a plurality of X-type multilevel power converters 150 that are arranged between the high-voltage DC power source 101 and the electric machine 10, with a DC-link capacitor 105 between the high-voltage DC power source 101 and the multi-phase power inverter 104 of the electric drivetrain 100, and with respective first AC power buses 121 and second AC power buses 122. As illustrated, and in one non-limiting aspect of the disclosure, the multi-phase power inverter 104 of the electric drivetrain 100 is composed with a quantity of three of the X-type multilevel power converters 150.

Figure 3:
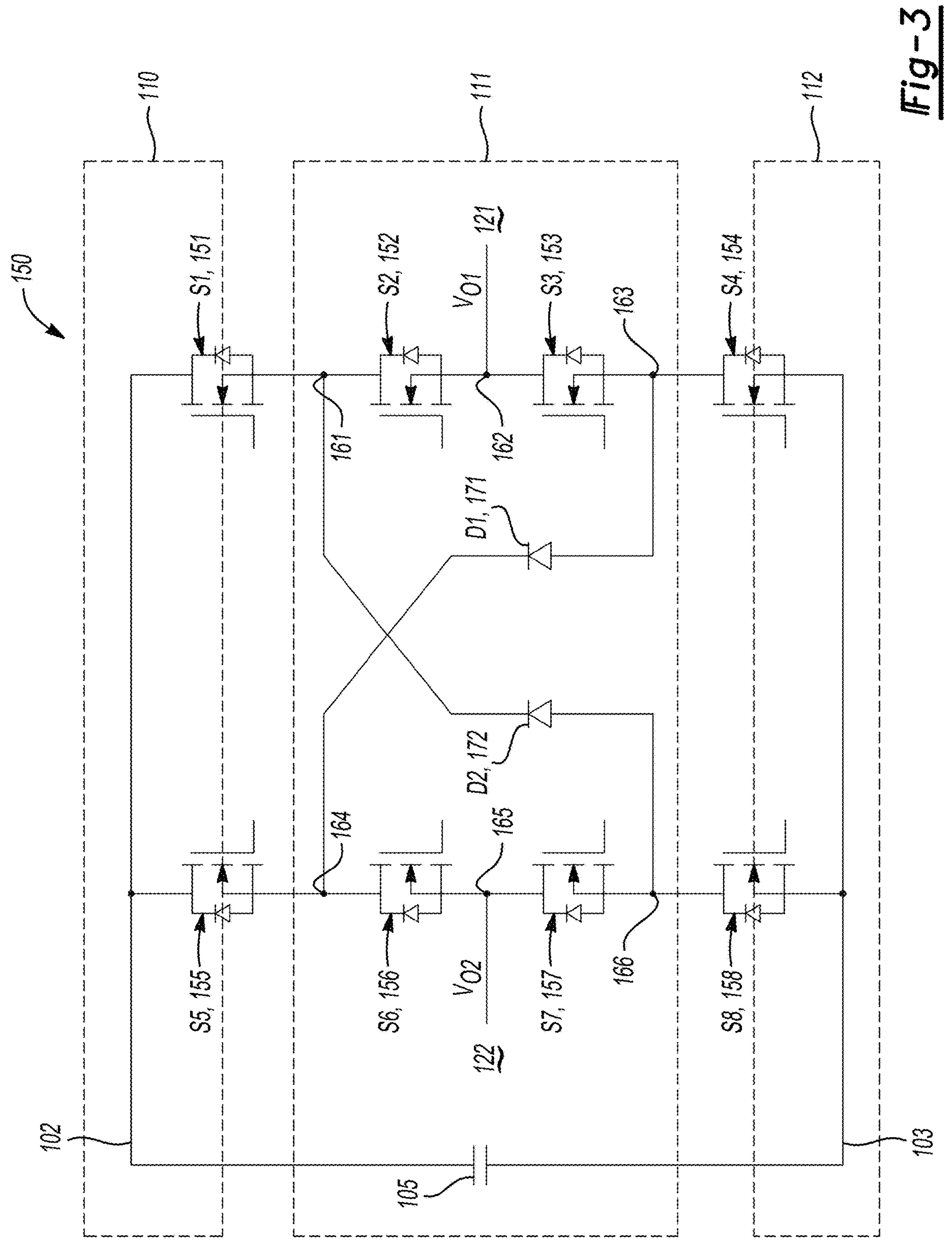
FIG. 3 schematically illustrates an electrical circuit diagram of an X-type multilevel power converter that is arranged as a solid-state integrated circuit (IC), in accordance with one aspect of the disclosure.

FIG. 3 schematically illustrates one of the X-type multilevel power converters 150, which is arranged as a solid-state integrated circuit (IC) having a plurality of semiconductor switches that are disposed in a laterally sectioned arrangement. The plurality of semiconductor switches includes, in one aspect of the disclosure and as shown, a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a seventh semiconductor switch S7 157, and an eighth semiconductor switch S8 158. In one aspect of the disclosure, at least a portion of the semiconductor switches are field-effect transistors (FETs). In one aspect of the disclosure, the FETs are gallium nitride (GaN) transistors. In one aspect of the disclosure, at least a portion of the semiconductor switches are insulated-gate bipolar transistors (IGBTs).

Other constituent elements of the X-type multilevel power converter 150 includes a first clamping diode D1 171, a second clamping diode D2 172, a positive DC power bus 110, a neutral bus 111, and a negative DC power bus 112. The positive DC power bus 110 is connected to the positive link 102 of the high-voltage DC bus, and the negative DC power bus 112 is connected to the negative link 103 of the high-voltage DC bus.

The first semiconductor switch S1 151, the second semiconductor switch S2 152, third semiconductor switch S3 153, and the fourth semiconductor switch S4 154 are arranged in series between the positive DC power bus 110 and the negative DC power bus 112. This includes: the first semiconductor switch S1 151 being connected to the second semiconductor switch S2 152 at first node 161; the second semiconductor switch S2 152 being connected to the third semiconductor switch S3 153 at second node 162; the third semiconductor switch S3 153 being connected to the fourth semiconductor switch S4 154 at third node 163.

The fifth semiconductor switch S5 155, sixth semiconductor switch S6 156, seventh semiconductor switch S7 157, and eighth semiconductor switch S8 158 are arranged in series between the positive DC power bus 110 and the negative DC power bus 112. This includes: the fifth semiconductor switch S5 155 being connected to the sixth semiconductor switch S6 156 at fourth node 164; the sixth semiconductor switch S6 156 being connected to the seventh semiconductor switch S7 157 at fifth node 165; and the seventh semiconductor switch S7 157 being connected to the eighth semiconductor switch S8 158 at sixth node 166.

A first clamping diode D1 171 is arranged between the fourth node 164 and the third node 163, with the anode of the first clamping diode D1 171 being connected to the fourth node 164 and the cathode of the first clamping diode D1 171 being connected to the third node 163.

A second clamping diode D2 172 is arranged between the first node 161 and the sixth node 166, with the anode of the second clamping diode D2 172 being connected to the sixth node 166 and the cathode of the second clamping diode D2 172 being connected to the first node 161.

The first node 161 connects to the first AC power bus 121 to transfer power to the electric machine 10 (shown with reference to FIG. 2).

The second node 162 connects to the second AC power bus 122 to transfer power to the electric machine 10 (shown with reference to FIG. 2).

A positive DC power bus 110, a neutral power bus 111, and a negative DC power bus 112, are schematically illustrated.

As schematically illustrated in FIG. 4, an X-type multilevel converter 150 includes a first leg 150A, a second leg 150B, power module substrates 180A, 180B, and heat sinks 142A, 142B. Each of the first leg 150A and the second leg 150B is arranged adjacent to respective first sides 180A-1, 180A-2 of the power module substrates 180A, 180B. Each of the heat sinks 142A, 142B are arranged adjacent to respective second sides 180A-2, 180B-2 of the power module substrates 180A, 180B.

The first leg 150A is connected to the second leg by interconnection(s) schematically illustrated at 190, which may include one or more interconnection(s) that electrically connect the first leg 150A and the second leg 150B.

Figures 5A, 5B, 5C:
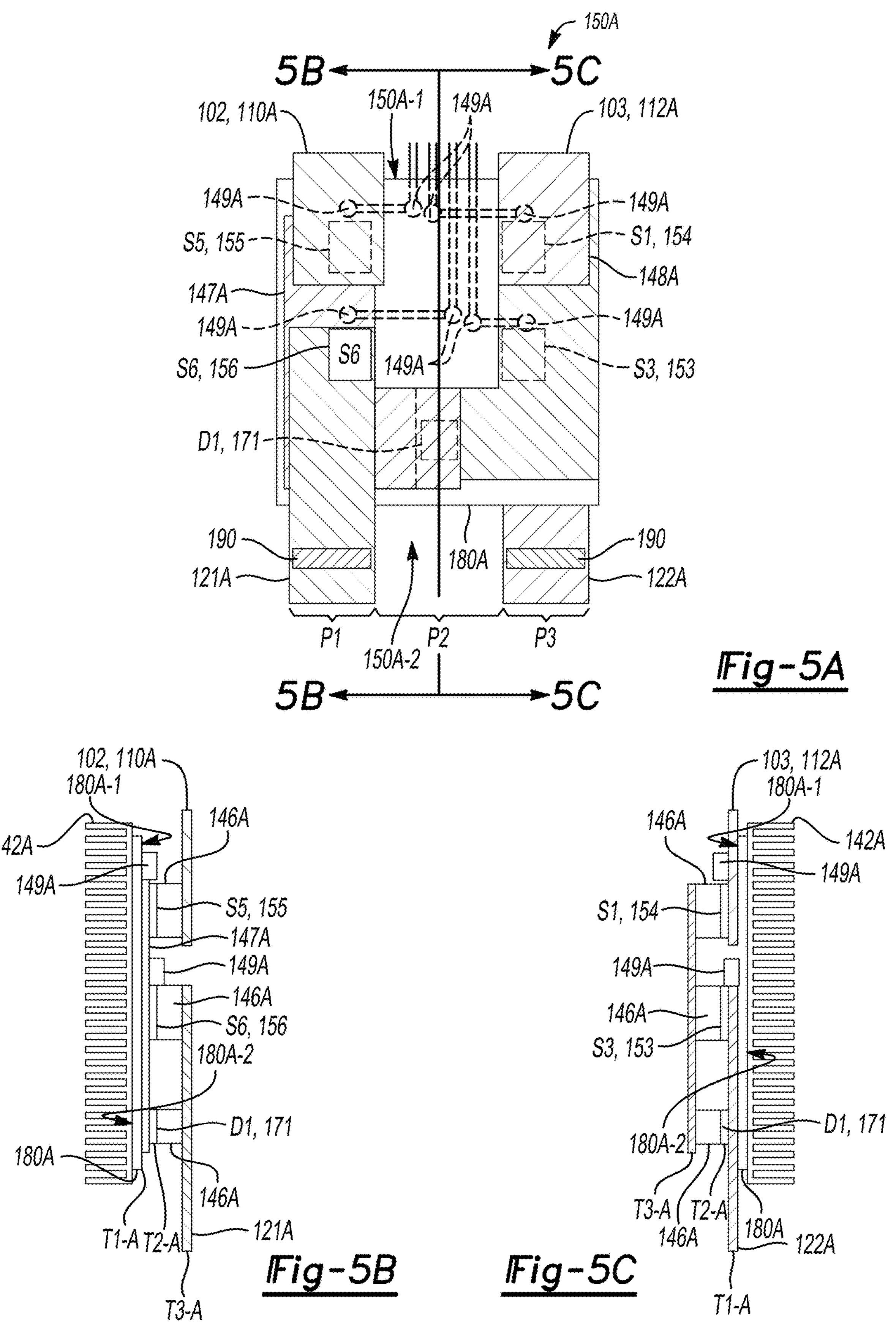
FIG. 5A schematically illustrates a plan view of a first leg of an X-type multilevel power converter schematically illustrated in FIG. 4 including a plurality of semiconductor switches each having a single die, in accordance with one aspect of the disclosure.
FIG. 5B schematically illustrates a sectional side view of the first leg through section B-B of FIG. 5A of the X-type multilevel power converter schematically illustrated in FIG. 4 including a plurality of semiconductor switches each having a single die, in accordance with one aspect of the disclosure.
FIG. 5C schematically illustrates a sectional side view of the first leg through section C-C of FIG. 5A of the X-type multilevel power converter schematically illustrated in FIG. 4 including a plurality of semiconductor switches each having a single die, in accordance with one aspect of the disclosure.

As schematically illustrated in FIGS. 5A, and 5B with continued reference to FIGS. 3 and 4, a first leg 150A (FIG. 5A) of an X-type multilevel power converter 150 is arranged adjacent to a first side 180A-1 of a power module substrate 180A, and a second leg 150B (FIG. 5D) of the X-type multilevel power converter 150 is arranged adjacent to a first side 180B-1 of a power module substrate 180B.

The first leg 150A and the second leg 150B include a plurality of semiconductor switches disposed in a tiered arrangement on the power module substrates 180A, 180B.

The plurality of semiconductor switches includes, in one aspect of the disclosure and as shown, a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a seventh semiconductor switch S7 157, and an eighth semiconductor switch S8 158.

As schematically illustrated in FIG. 5A, FIG. 5B, and FIG. 5C the first leg 150A of the X-type multilevel power converter 150 (FIG. 4) includes a positive DC power bus 110A, a negative DC power bus 112A, a first alternating current (AC) bus 121A, a second AC power bus 122A, a first clamping diode D1 171, a first conductive layer 147A, a second conductive layer 148A, a first power module substrate 180A, a first heat sink 142A adjacent to a second side 180A-2 of the first power module substrate 180A, a first plurality of semiconductor switches including the third semiconductor switch S3 153, the fourth semiconductor switch S4 154, and the fifth semiconductor switch S5 155 and sixth semiconductor switch S6 156, and a first plurality of conductive spacers 146A.

The first plurality of conductive spacers 146A is arranged between the fifth semiconductor switch S5 155 and the positive DC power bus 110A, the sixth semiconductor switch S6 156 and the first AC bus 121A, the fourth semiconductor switch S4 154 and the second conductive layer 148A, the third semiconductor switch S3 153 and the second conductive layer 148A, and the first clamping diode D1 171 and the second conductive layer 148A.

The first plurality of semiconductor switches, the first leg positive DC power bus 110A, the first leg negative DC power bus 112A, the first leg first AC bus 121A, the first leg second AC bus 122A, the first leg first conductive layer 147A, the first leg second conductive layer 148A, and the first clamping diode D1 171 are arranged into a plurality of tiers including a first tier T1-A, a second tier T2-A, and a third tier T3-A.

The first tier T1-A is composed of the first leg first conductive layer 147A arranged coplanar with the first leg first negative DC power bus 112A that is arranged coplanar with the first leg second AC bus 122A.

The second tier T2-A is composed of the first clamping diode D1 171 arranged coplanar with the third semiconductor switch S3 153 arranged coplanar with the fourth semiconductor switch S4 154 that is arranged coplanar with the fifth semiconductor switch S5 155 that is arranged coplanar with the sixth semiconductor switch S6 156.

The third tier T3-A is composed of the first leg second conductive layer 148A arranged coplanar with the first leg first positive DC power bus 110A arranged coplanar the first leg first AC bus 121A.

Figures 5D, 5E, 5F:
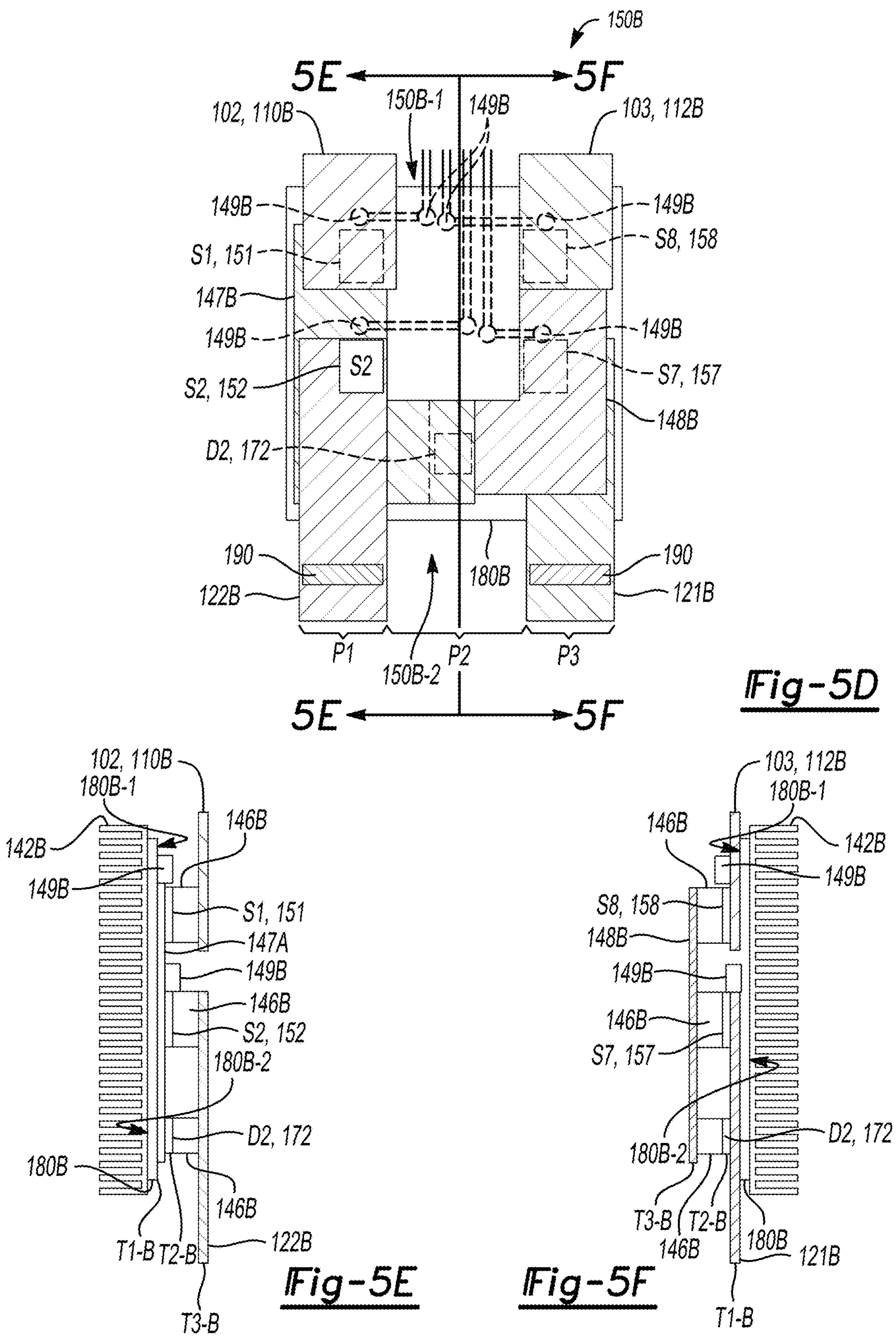
FIG. 5D schematically illustrates a plan view of a second leg of a X-type multilevel power converter schematically illustrated in FIG. 4 including a plurality of semiconductor switches each having a single die, in accordance with one aspect of the disclosure.
FIG. 5E schematically illustrates a sectional side view of the second leg through section E-E of FIG. 5D of the X-type multilevel power converter schematically illustrated in FIG. 4 including a plurality of semiconductor switches each having a single of die, in accordance with one aspect of the disclosure.
FIG. 5F schematically illustrates a sectional side view of the second leg through section F-F of FIG. 5D of the X-type multilevel power converter schematically illustrated in FIG.

As schematically illustrated in FIG. 5D, FIG. 5E, and FIG. 5F the second leg 150B of the X-type multilevel power converter 150 (FIG. 4) includes a positive DC power bus 110B, a negative DC power bus 112B, a first AC bus 121B, a second AC bus 122B, a second clamping diode D2 172, a first conductive layer 147B, a second conductive layer 148B, a second power module substrate 180B, a second heat sink 142B adjacent to a second side 180B-2 of the second power module substrate 180B, a second plurality of semiconductor switches including the first semiconductor switch S1 151, the second semiconductor switch S2 152, the seventh semiconductor switch S7 157, and the eighth semiconductor switch S8 158, and a second plurality of conductive spacers 146B.

The second plurality of conductive spacers 146B is arranged between the first semiconductor switch S1 151 and the positive DC power bus 110B, the second semiconductor switch S2 152 and the second AC bus 121B, the eighth semiconductor switch S8 158 and the second conductive layer 148B, the seventh semiconductor switch S7 157 and the second conductive layer 148B, and the second clamping diode D2 172 and the second conductive layer 148B.

The second plurality of semiconductor switches, the second leg positive DC power bus 110B, the second leg negative DC power bus 112B, the second leg first AC bus 121B, the second leg second AC bus 122B, the second leg first conductive layer 147B, the second leg second conductive layer 148B, and the second clamping diode D1 172 are arranged into a plurality of tiers including a first tier T1-B, a second tier T2-B, and a third tier T3-B.

The first tier T1-B is composed of the second leg first conductive layer 147B arranged coplanar with the second leg first negative DC power bus 112B that is arranged coplanar with the second leg second AC bus 122B.

The second tier T2-B is composed of the second clamping diode D2 172 arranged coplanar with the first semiconductor switch S1 151 arranged coplanar with the second semiconductor switch S2 152 that is arranged coplanar with the seventh semiconductor switch S7 157 that is arranged coplanar with the eighth semiconductor switch S8 158.

The third tier T3-B is composed of second leg second conductive layer 148B arranged coplanar with the second leg first positive DC power bus 110B arranged coplanar the second leg first AC bus 121B.

According to one aspect of the disclosure, the multilevel power converter 150 includes a first heat sink 142A, and a second heat sink 142B.

Referring back to FIG. 5B, and FIG. 5C the first leg first conductive layer 147A, the first leg negative DC power bus 112A, and the first leg second AC bus 122A are arranged adjacent to the first side 180A-1 of the first power module substrate 180A.

The first heat sink 142A is arranged adjacent to the second side 180A-2 of the first power module substrate 180A.

Referring back to FIG. 5E, and FIG. 5F the second leg first conductive layer 147B, the second leg negative DC power bus 112B, and the second leg second AC bus 122B are arranged adjacent to the first side 180B-1 of the second power module substrate 180B.

The second heat sink 142B is arranged adjacent to the second side 180B-2 of the second power module substrate 180B.

As illustrated in FIG. 5A, the fifth semiconductor switch S5 155, the sixth semiconductor switch S6 156, the first leg positive DC bus 110A, and the first leg first AC bus 121A are arranged on a first portion P1 of the first power module substrate 180A. The first clamping diode D1 171, and a first plurality of gate/source pins 149A are arranged on a second portion P2 of the first power module substrate 180-A. The fourth semiconductor switch S4 154, the third semiconductor switch S3 153, the first leg negative DC bus 112A, and the first leg second AC bus 122A are arranged on a third portion P3 of the first power module substrate 180A.

The first portion P1, the second portion P2, and the third portion P3 of the first power module substrate 180A are coplanar. The second portion P2 is arranged between the first portion P1 and the third portion P3.

As illustrated in FIG. 5D, the first semiconductor switch S1 151, the second semiconductor switch S2 152, the second leg positive DC power bus 110B, and the second leg second AC bus 122B are arranged on a first portion P1 of the second power module substrate 180-B. The second clamping diode D2 172, and a second plurality of gate/source pins 149B are arranged on a second portion P2 of the second power module substrate 180B. The eighth semiconductor switch S8 158, the seventh semiconductor switch S7 157, the second leg negative DC bus 112B, and the second leg first AC bus 121B are arranged on a third portion P3 of the second power module substrate 180B.

The first portion P1, the second portion P2, and the third portion P3 of the second power module substrate 180B are coplanar. The second portion P2 is arranged between the first portion P1 and the third portion P3.

According to one aspect of the disclosure, the first plurality of gate/source pins 149A and the second plurality of gate/source pins 149B are configured to pop out vertically from the first power module substrate 180A and the second power module substrate 180B respectively.

According to one aspect of the disclosure, the first leg positive DC power bus 110A, the first leg negative DC power bus 112A, the second leg positive DC power bus 110B, and the second leg negative DC power bus 112B are arranged at a first end 150A-1 of the X-type multilevel power converter 150, and the first leg first AC bus 121A, the first leg second AC bus 122A, the second leg first AC bus 121B, and the second leg second AC bus 122B are arranged at a second end 150A-2 of the X-type multilevel power converter 150.

According to one aspect of the disclosure, each of the first plurality of semiconductor switches and the second semiconductor switches includes a single die.

According to one aspect of the disclosure, each single die includes a vertical device.

Referring back to FIG. 4 with continued reference to FIGS. 5A and 5D, the first leg 150A (FIG. 5A) and the second leg 150B (FIG. 5D) of the X-type multilevel power converter 150 are electrically connected by interconnections 190 arranged between the first AC bus 121A of the first leg 150A and the first AC bus 121B of the second leg 150B, and the second AC bus 122A of the first leg 150A and the second AC bus 122B of the second leg 150B.

As illustrated in FIG. 6A, and FIG. 6D with continued reference to FIGS. 3 and 4, a first leg 250A (FIG. 6A) of an X-type multilevel power converter 150 is arranged adjacent to a first side 280A-1 of a power module substrate 280A, and a second leg 250B (FIG. 6D) of the X-type multilevel power converter 150 is arranged adjacent to a first side 280B-1 of a power module substrate 280B.

The first leg 250A and the second leg 250B include a plurality of semiconductor switches disposed in a tiered arrangement on the power module substrates 280A, 280B.

The plurality of semiconductor switches includes, in one aspect of the disclosure and as shown, a first semiconductor switch S1 251, a second semiconductor switch S2 252, a third semiconductor switch S3 253, a fourth semiconductor switch S4 254, a fifth semiconductor switch S5 255, a sixth semiconductor switch S6 256, a seventh semiconductor switch S7 257, and an eighth semiconductor switch S8 258.

As schematically illustrated in FIG. 6A, FIG. 6B, and FIG. 6C the first leg 250A of the X-type multilevel power converter 150 (FIG. 4) includes a positive DC power bus 210A, a negative DC power bus 212A, a first alternating current (AC) bus 221A, a second AC power bus 222A, a first clamping diode D1 271, a first conductive layer 247A, a second conductive layer 248A, a first power module substrate 280A, a first heat sink 242A adjacent to a second side 280A-2 of the first power module substrate 280A, a first plurality of semiconductor switches including the third semiconductor switch S3 253, the fourth semiconductor switch S4 254, and the fifth semiconductor switch S5 255 and sixth semiconductor switch S6 256, and a first plurality of conductive spacers 246A.

The first plurality of conductive spacers 246A is arranged between the fifth semiconductor switch S5 255 and the positive DC power bus 210A, the sixth semiconductor switch S6 256 and the first AC bus 221A, the fourth semiconductor switch S4 254 and the second conductive layer 248A, the third semiconductor switch S3 253 and the second conductive layer 248A, and the first clamping diode D1 271 and the second conductive layer 248A.

The first plurality of semiconductor switches, the first leg positive DC power bus 210A, the first leg negative DC power bus 212A, the first leg first AC bus 221A, the first leg second AC bus 222A, the first leg first conductive layer 247A, the first leg second conductive layer 248A, and the first clamping diode D1 271 are arranged into a plurality of tiers including a first tier T1-A, a second tier T2-A, and a third tier T3-A.

The first tier T1-A is composed of the first leg first conductive layer 247A arranged coplanar with the first leg first negative DC power bus 212A that is arranged coplanar with the first leg second AC bus 222A.

The second tier T2-A is composed of the first clamping diode D1 271 arranged coplanar with the third semiconductor switch S3 253 arranged coplanar with the fourth semiconductor switch S4 254 that is arranged coplanar with the fifth semiconductor switch S5 255 that is arranged coplanar with the sixth semiconductor switch S6 256.

The third tier T3-A is composed of the first leg second conductive layer 248A arranged coplanar with the first leg first positive DC power bus 210A arranged coplanar the first leg first AC bus 221A.

As schematically illustrated in FIG. 6D, FIG. 6E, and FIG. 6F the second leg 250B of the X-type multilevel power converter 150 (FIG. 4) includes a positive DC power bus 210B, a negative DC power bus 212B, a second AC bus 221B, a second AC power bus 222B, a second clamping diode D2 272, a first conductive layer 247B, a second conductive layer 248B, a second power module substrate 280B, a second heat sink 242B adjacent to a second side 280B-2 of the second power module substrate 280B, a second plurality of semiconductor switches including the first semiconductor switch S1 251, the second semiconductor switch S2 252, the seventh semiconductor switch S7 257, and the eighth semiconductor switch S8 258, and a second plurality of conductive spacers 246B.

The second plurality of conductive spacers 246B is arranged between the first semiconductor switch S1 251 and the positive DC power bus 210B, the second semiconductor switch S2 252 and the second AC bus 221B, the eighth semiconductor switch S8 258 and the second conductive layer 248B, the seventh semiconductor switch S7 257 and the second conductive layer 248B, and the second clamping diode D2 272 and the second conductive layer 248B.

The second plurality of semiconductor switches, the second leg positive DC power bus 210B, the second leg negative DC power bus 212B, the second leg first AC bus 221B, the second leg second AC bus 222B, the second leg first conductive layer 247B, the second leg second conductive layer 248B, and the second clamping diode D1 272 are arranged into a plurality of tiers including a first tier T1-B, a second tier T2-B, and a third tier T3-B.

The first tier T1-B is composed of the second leg first conductive layer 247B arranged coplanar with the second leg first negative DC power bus 212B that is arranged coplanar with the second leg second AC bus 222B.

The second tier T2-B is composed of the second clamping diode D2 272 arranged coplanar with the first semiconductor switch S1 251 arranged coplanar with the second semiconductor switch S2 252 that is arranged coplanar with the seventh semiconductor switch S7 257 that is arranged coplanar with the eighth semiconductor switch S8 258.

The third tier T3-B is composed of second leg second conductive layer 248B arranged coplanar with the second leg first positive DC power bus 210B arranged coplanar the second leg second AC bus 222B.

According to one aspect of the disclosure, the multilevel power converter 150 includes a first heat sink 242A, and a second heat sink 242B.

Referring back to FIG. 6B, and FIG. 6C the first leg first conductive layer 247A, the first leg negative DC power bus 212A, and the first leg second AC bus 222A are arranged adjacent to the first side 280A-1 of the first power module substrate 280A.

The first heat sink 242A is arranged adjacent to the 280A-2 of the first power module substrate 280A.

Referring back to FIG. 6E, and FIG. 6F the second leg first conductive layer 247B, the second leg negative DC power bus 212B, and the second leg second AC bus 222B are arranged adjacent to the first side 280B-1 of the second power module substrate 280B.

The second heat sink 242B is arranged adjacent to the second side 280B-2 of the second power module substrate 280B.

As illustrated in FIG. 6A, the fifth semiconductor switch S5 255, the sixth semiconductor switch S6 256, the first leg positive DC bus 210A, and the first leg first AC bus 221A are arranged on a first portion P1 of the first power module substrate 280A. The first clamping diode D1 271, and a first plurality of gate/source pins 249A are arranged on a second portion P2 of the first power module substrate 280A. The fourth semiconductor switch S4 254, the third semiconductor switch S3 253, the first leg negative DC bus 212A, and the first leg second AC bus 222A are arranged on a third portion P3 of the first power module substrate 280A.

The first portion P1, the second portion P2, and the third portion P3 of the first power module substrate 280A are coplanar. The second portion P2 is arranged between the first portion P1 and the third portion P3.

As illustrated in FIG. 6D, the first semiconductor switch S1 251, the second semiconductor switch S2 252, the second leg positive DC bus 210B, and the second leg second AC bus 222B are arranged on a first portion P1 of the second power module substrate 280B. The second clamping diode D2 272, and a second plurality of gate/source pins 249B are arranged on a second portion P2 of the second power module substrate 280B. The eighth semiconductor switch S8 258, the seventh semiconductor switch S7 257, the second leg negative DC bus 212B, and the second leg first AC bus 221B are arranged on a third portion P3 of the second power module substrate 280B.

The first portion P1, the second portion P2, and the third portion P3 of the second power module substrate 280B are coplanar. The second portion P2 is arranged between the first portion P1 and the third portion P3.

According to one aspect of the disclosure, the first plurality of gate/source pins 249A and the second plurality of gate/source pins 249B are configured to pop out vertically from the first power module substrate 280A and the second power module substrate 280B respectively.

According to one aspect of the disclosure, the first leg positive DC power bus 210A, the first leg negative DC power bus 212A, the second leg positive DC power bus 210B, and the second leg negative DC power bus 212B are arranged at a first end 250A-1 of the X-type multilevel power converter 250, and the first leg first AC bus 221A, the first leg second AC bus 222A, the second leg first AC bus 221B, and the second leg second AC bus 222B are arranged at a second end 250A-2 of the X-type multilevel power converter 250.

According to one aspect of the disclosure, each of the first plurality of semiconductor switches and the second semiconductor switches includes a plurality of dies.

According to one aspect of the disclosure, each plurality of dies includes a vertical device.

Referring back to FIG. 4 with continued reference to FIGS. 6A and 6D, the first leg 250A (FIG. 6A) and the second leg 250B (FIG. 6D) of the X-type multilevel power converter 150 are electrically connected by interconnections 290 arranged between the first AC bus 221A of the first leg 250A and the first AC bus 221B of the second leg 250B, and the second AC bus 222A of the first leg 250A and the second AC bus 222B of the second leg 250B.

As schematically illustrated in FIG. 7A, and FIG. 7D with continued reference to FIGS. 3 and 4, a first leg 350A (FIG. 7A) of an X-type multilevel power converter 150 is arranged adjacent to a first side 380A-1 of a power module substrate 380A, and a second leg 350B (FIG. 7D) of the X-type multilevel power converter 150 is arranged adjacent to a first side 380B-1 of a power module substrate 380B.

The first leg 350A and the second leg 350B include a plurality of semiconductor switches disposed in a tiered arrangement on the power module substrates 380A, 380B.

The plurality of semiconductor switches includes, in one aspect of the disclosure and as shown, a first semiconductor switch S1 351, a second semiconductor switch S2 352, a third semiconductor switch S3 353, a fourth semiconductor switch S4 354, a fifth semiconductor switch S5 355, a sixth semiconductor switch S6 356, a seventh semiconductor switch S7 357, and an eighth semiconductor switch S8 358.

As schematically illustrated in FIG. 7A, FIG. 7B, and FIG. 7C the first leg 350A of the X-type multilevel power converter 150 (FIG. 4) includes a positive DC power bus 310A, a negative DC power bus 312A, a first alternating current (AC) bus 321A, a second AC power bus 322A, a first clamping diode D1 371, a first conductive layer 347A, a second conductive layer 348A, a first power module substrate 380A, a first heat sink 342A adjacent to a second side 380A-2 of the first power module substrate 380A, a first plurality of semiconductor switches including the third semiconductor switch S3 353, the fourth semiconductor switch S4 354, and the fifth semiconductor switch S5 355 and sixth semiconductor switch S6 356, and a first plurality of conductive spacers 346A.

The first plurality of conductive spacers 346A is arranged between the first clamping diode D1 371 and a first portion 347A-1 of the first conductive layer 347A.

The first plurality of semiconductor switches, the first leg positive DC power bus 310A, the first leg negative DC power bus 312A, the first leg first AC bus 321A, the first leg second AC bus 322A, the first leg first conductive layer 347A, the first leg second conductive layer 348A, and the first clamping diode D1 371 are arranged into a plurality of tiers including a first tier T1-A, a second tier T2-A, and a third tier T3-A.

The first tier T1-A is composed of the first leg first AC bus 321A arranged coplanar with the first leg second AC bus 322A arranged coplanar with the first portion 347A-1 of the first leg first conductive layer 347A that is arranged coplanar with the first leg first positive DC power bus 310A that is arranged coplanar with the first leg negative DC power bus 312A.

The second tier T2-A is composed of the first clamping diode D1 371 arranged coplanar with the third semiconductor switch S3 353 arranged coplanar with the fourth semiconductor switch S4 354 that is arranged coplanar with the fifth semiconductor switch S5 355 that is arranged coplanar with the sixth semiconductor switch S6 356.

The third tier T3-A is composed of a second portion 347A-2 of the first leg first conductive layer 347A.

As schematically illustrated in FIG. 7D, FIG. 7E, and FIG. 7F the second leg 350B of the X-type multilevel power converter 150 (FIG. 4) includes a positive DC power bus 310B, a negative DC power bus 312B, a first AC bus 321B, a second AC power bus 322B, a second clamping diode D2 372, a first conductive layer 347B, a second conductive layer 348B, a first power module substrate 380B, a second heat sink 342B adjacent to a second side 380B-2 of the first power module substrate 380B, a second plurality of semiconductor switches including the first semiconductor switch S1 351, the second semiconductor switch S2 352, the seventh semiconductor switch S7 357, and the eighth semiconductor switch S8 358, and a second plurality of conductive spacers 346B.

The second plurality of conductive spacers 346B is arranged between the second clamping diode D2 372 and the first conductive layer 347B.

The second plurality of semiconductor switches, the second leg positive DC power bus 310B, the second leg negative DC power bus 312B, the second leg first AC bus 321B, the second leg second AC bus 322B, the second leg first conductive layer 347B, the second leg second conductive layer 348B, and the second clamping diode D2 372 are arranged into a plurality of tiers including a first tier T1-B, a second tier T2-B, and a third tier T3-B.

The first tier T1-B is composed of the second leg first AC bus 321B is arranged coplanar with the second leg second AC bus 322B arranged coplanar with the first portion 347B-1 of the second leg first conductive layer 347B that is arranged coplanar with the second leg positive DC power bus 310B that is arranged coplanar with the second leg negative DC power bus 312B.

The second tier T2-B is composed of the second clamping diode D2 372 arranged coplanar with the first semiconductor switch S1 351 arranged coplanar with the second semiconductor switch S2 352 that is arranged coplanar with the seventh semiconductor switch S7 357 that is arranged coplanar with the eighth semiconductor switch S8 358.

The third tier T3-B is composed of a second portion 347B-2 of the second leg first conductive layer 347B.

According to one aspect of the disclosure, the multilevel power converter 150 includes a first heat sink 342A, and a second heat sink 342B.

Referring back to FIG. 7B, and FIG. 7C the first leg first conductive layer 347A, the first leg negative DC power bus 312A, and the first leg second AC bus 322A are arranged adjacent to the first side 380A-1 of the first power module substrate 380A.

The first heat sink 342A is arranged adjacent to the second side 380A-2 of the first power module substrate 380A.

Referring back to FIG. 7E, and FIG. 7F the second leg first conductive layer 347B, the second leg negative DC power bus 312B, and the second leg second AC bus 322B are arranged adjacent to the first side 380B-1 of the second power module substrate 380B.

The second heat sink 342B is arranged adjacent to the second side 380B-2 of the second power module substrate 380B.

As illustrated in FIG. 7A, the fifth semiconductor switch S5 355, the sixth semiconductor switch S6 366, a first portion 349A-1 of a first plurality of gate/source pins 349A-1, the first leg first AC bus 321A, and the first leg positive DC power bus 310A are arranged on a first portion P1 of the first power module substrate 380A. The first clamping diode D1 371, and a second portion 349A-2 of the first plurality of gate/source pins 349A are arranged on a second portion P2 of the first power module substrate 380A. The third semiconductor switch S3 353, the fourth semiconductor switch S4 354, a third portion 349A-3 of the first plurality of gate/source pins 349A, the first leg second AC bus 322A, and the first leg negative DC power bus 312A are arranged on a third portion P3 of the first power module substrate 380A.

The first portion P1, the second portion P2, and the third portion P3 of the first power module substrate 380A are coplanar. The second portion P2 is arranged between the first portion P1 and the third portion P3.

As illustrated in FIG. 7D, the first semiconductor switch S1 351, the second semiconductor switch S2 352, a first portion 349B-1 of the second plurality of gate/source pins 349B, the second leg positive DC bus 310B, and the second leg second AC bus 322B are arranged on a first portion P1 of the second power module substrate 380B. The second clamping diode D2 372, and a second portion 349B-2 of the second plurality of gate/source pins 349B are arranged on a second portion P2 of the second power module substrate 380B. The eighth semiconductor switch S8 358, the seventh semiconductor switch S7 357, a third portion 349B-3 of the second plurality of gate/source pins 349B, the second leg negative DC bus 312B, and the second leg first AC bus 321B are arranged on a third portion P3 of the second power module substrate 380B.

The first portion P1, the second portion P2, and the third portion P3 of the second power module substrate 380B are coplanar. The second portion P2 is arranged between the first portion P1 and the third portion P3.

According to one aspect of the disclosure, the first plurality of gate/source pins 349A and the second plurality of gate/source pins 349B are configured to pop out vertically from the first power module substrate 380A and the second power module substrate 380B respectively.

According to one aspect of the disclosure, the first leg positive DC power bus 310A, the first leg negative DC power bus 312A, the second leg positive DC power bus 310B, and the second leg negative DC power bus 312B are arranged at a first end 350A-1 of the X-type multilevel power converter 350, and the first leg first AC bus 321A, the first leg second AC bus 322A, the second leg first AC bus 321B, and the second leg second AC bus 322B are arranged at a second end 350A-2 of the X-type multilevel power converter 350.

According to one aspect of the disclosure, each of the first plurality of semiconductor switches and the second semiconductor switches includes a single die.

According to one aspect of the disclosure, each single die includes a lateral device.

Referring back to FIG. 4 with continued reference to FIGS. 7A and 7D, the first leg 350A (FIG. 7A) and the second leg 350B (FIG. 7D) of the X-type multilevel power converter 150 are electrically connected by interconnections 390 arranged between the first AC bus 321A of the first leg 350A and the first AC bus 321B of the second leg 350B, and the second AC bus 322A of the first leg 350A and the second AC bus 322B of the second leg 350B.

As illustrated in FIGS. 8A, and 8D, with continued reference to FIGS. 3 and 4, a first leg 450A (FIG. 8A) of an X-type multilevel power converter 150 is arranged adjacent to a first side 480A-1 of a power module substrate 480A, and a second leg 450B (FIG. 8D) of the X-type multilevel power converter 150 is arranged adjacent to a first side 480B-1 of a power module substrate 480B.

The first leg 450A and the second leg 450B include a plurality of semiconductor switches disposed in a tiered arrangement on the power module substrates 480A, 480B.

The plurality of semiconductor switches includes, in one aspect of the disclosure and as shown, a first semiconductor switch S1 451, a second semiconductor switch S2 452, a third semiconductor switch S3 453, a fourth semiconductor switch S4 454, a fifth semiconductor switch S5 455, a sixth semiconductor switch S6 456, a seventh semiconductor switch S7 457, and an eighth semiconductor switch S8 458.

As schematically illustrated in FIG. 8A, FIG. 8B, and FIG. 8C the first leg 450A of the X-type multilevel power converter 150 (FIG. 4) includes a positive DC power bus 410A, a negative DC power bus 412A, a first alternating current (AC) bus 421A, a second AC power bus 422A, a first clamping diode D1 471, a first conductive layer 447A, a second conductive layer 448A, a first power module substrate 480A, a first heat sink 442A adjacent to a second side 480A-2 of the first power module substrate 480A, a first plurality of semiconductor switches including the third semiconductor switch S3 453, the fourth semiconductor switch S4 454, and the fifth semiconductor switch S5 455 and sixth semiconductor switch S6 456, and a first plurality of conductive spacers 446A.

The first plurality of conductive spacers 446A is arranged between the first clamping diode D1 471 and a first portion 447A-1 of the first conductive layer 447A.

The first plurality of semiconductor switches, the first leg positive DC power bus 410A, the first leg negative DC power bus 412A, the first leg first AC bus 421A, the first leg second AC bus 422A, the first leg first conductive layer 447A, the first leg second conductive layer 448A, and the first clamping diode D1 471 are arranged into a plurality of tiers including a first tier T1-A, a second tier T2-A, and a third tier T3-A.

The first tier T1-A is composed of the first leg first AC bus 421A arranged coplanar with the first leg second AC bus 422A arranged coplanar with the first portion 447A-1 of the first leg first conductive layer 447A that is arranged coplanar with the first leg first positive DC power bus 410A that is arranged coplanar with the first leg negative DC power bus 412A.

The second tier T2-A is composed of the first clamping diode D1 471 arranged coplanar with the third semiconductor switch S3 453 arranged coplanar with the fourth semiconductor switch S4 454 that is arranged coplanar with the fifth semiconductor switch S5 455 that is arranged coplanar with the sixth semiconductor switch S6 456.

The third tier T3-A is composed of a second portion 447A-2 of the first leg first conductive layer 447A.

As schematically illustrated in FIG. 8D, FIG. 8E, and FIG. 8F the second leg 450B of the X-type multilevel power converter 150 (FIG. 4) includes a positive DC power bus 410B, a negative DC power bus 412B, a first AC bus 421B, a second AC power bus 422B, a second clamping diode D2 472, a first conductive layer 447B, a second conductive layer 448B, a first power module substrate 480B, a second heat sink 442B adjacent to a second side 480B-2 of the second power module substrate 480B, a second plurality of semiconductor switches including the first semiconductor switch S1 451, the second semiconductor switch S2 452, the seventh semiconductor switch S7 457, and the eighth semiconductor switch S8 458, and a second plurality of conductive spacers 446B.

The second plurality of conductive spacers 446B is arranged between the second clamping diode D2 472 and the first conductive layer 447B.

The second plurality of semiconductor switches, the second leg positive DC power bus 410B, the second leg negative DC power bus 412B, the second leg first AC bus 421B, the second leg second AC bus 422B, the second leg first conductive layer 447B, the second leg second conductive layer 448B, and the second clamping diode D1 472 are arranged into a plurality of tiers including a first tier T1-B, a second tier T2-B, and a third tier T3-B.

The first tier T1-B is composed of the second leg first AC bus 421B is arranged coplanar with the second leg second AC bus 422B arranged coplanar with the first portion 447B-1 of the second leg first conductive layer 447B that is arranged coplanar with the second leg positive DC power bus 410B that is arranged coplanar with the second leg negative DC power bus 412B.

The second tier T2-B is composed of the second clamping diode D2 472 arranged coplanar with the first semiconductor switch S1 451 arranged coplanar with the second semiconductor switch S2 452 that is arranged coplanar with the seventh semiconductor switch S7 457 that is arranged coplanar with the eighth semiconductor switch S8 458.

The third tier T3-B is composed of a second portion 447B-2 of the second leg first conductive layer 447B.

According to one aspect of the disclosure, the multilevel power converter 150 includes a first heat sink 442A, and a second heat sink 442B.

Referring back to FIG. 8B, and FIG. 8C the first leg first conductive layer 447A, the first leg negative DC power bus 412A, and the first leg second AC bus 422A are arranged adjacent to the first side 480A-1 of the first power module substrate 480A.

The first heat sink 442A is arranged adjacent to the second side 480A-2 of the first power module substrate 480A.

Referring back to FIG. 8E, and FIG. 8F the second leg first conductive layer 447B, the second leg negative DC power bus 412B, and the second leg second AC bus 422B are arranged adjacent to the first side 480B-1 of the second power module substrate 480B.

The second heat sink 442B is arranged adjacent to the second side 480B-2 of the second power module substrate 480B.

As illustrated in FIG. 8A, the fifth semiconductor switch S5 455, the sixth semiconductor switch S6 456, the first leg first AC bus 421A, and the first leg positive DC power bus 410A are arranged on a first portion P1 of the first power module substrate 480A. The first clamping diode D1 471, and a first plurality of gate/source pins 449A are arranged on a second portion P2 of the first power module substrate 480A. The third semiconductor switch S3 453, the fourth semiconductor switch S4 454, the first leg second AC bus 422A, and the first leg negative DC power bus 412A are arranged on a third portion P3 of the first power module substrate 480A.

The first portion P1, the second portion P2, and the third portion P3 of the first power module substrate 480A are coplanar. The second portion P2 is arranged between the first portion P1 and the third portion P3.

As illustrated in FIG. 8D, the first semiconductor switch S1 451, the second semiconductor switch S2 452, the second leg positive DC power bus 410B, and the second leg second AC bus 422B are arranged on a first portion P1 of the second power module substrate 480B. The second clamping diode D2 472, and a second plurality of gate/source pins 449B are arranged on a second portion P2 of the second power module substrate 480B. The eighth semiconductor switch S8 458, the seventh semiconductor switch S7 457, the second leg negative DC bus 412B, and the second leg first AC bus 421B are arranged on a third portion P3 of the second power module substrate 480B.

The first portion P1, the second portion P2, and the third portion P3 of the second power module substrate 480B are coplanar. The second portion P2 is arranged between the first portion P1 and the third portion P3.

According to one aspect of the disclosure, the first plurality of gate/source pins 449A and the second plurality of gate/source pins 449B are configured to pop out vertically from the first power module substrate 480A and the second power module substrate 480B respectively.

According to one aspect of the disclosure, the first leg positive DC power bus 410A, the first leg negative DC power bus 412A, the second leg positive DC power bus 410B, and the second leg negative DC power bus 412B are arranged at a first end 450A-1 of the X-type multilevel power converter 450, and the first leg first AC bus 421A, the first leg second AC bus 422A, the second leg first AC bus 421B, and the second leg second AC bus 422B are arranged at a second end 450A-2 of the X-type multilevel power converter 450.

According to one aspect of the disclosure, each of the first plurality of semiconductor switches and the second semiconductor switches includes a plurality of dies.

According to one aspect of the disclosure, each of the plurality of dies includes a lateral device.

Referring back to FIG. 4 with continued reference to FIGS. 8A and 8D, the first leg 450A (FIG. 8A) and the second leg 450B (FIG. 8D) of the X-type multilevel power converter 150 are electrically connected by interconnections 490 arranged between the first AC bus 421A of the first leg 450A and the first AC bus 421B of the second leg 450B, and the second AC bus 422A of the first leg 450A and the second AC bus 422B of the second leg 450B.

By configuring the topology within each of the X-type multilevel converters as illustrated above, both the positive DC power bus and the negative DC power bus are parallel with the auxiliary or neutral bus generating mutual inductance cancellation that minimizes parasitic inductance by coupling positive mutual inductance and negative mutual inductance for commutation loop currents within each of the X-type multilevel converters.

Further, including clamping diodes internal to the X-type multilevel converter also reduces the commutation loop within the X-type multilevel converter.

The concepts and aspects of the disclosure described herein facilitate various heat transfer and cooling systems, including direct cooling, indirect cooling, immersive cooling, single-sided or double-sided cooling.

These and other attendant benefits of the present disclosure will be appreciated by those skilled in the art in view of the foregoing disclosure.

The detailed description and the drawings or figures are supportive and descriptive of the present teachings, but the scope of the present teachings is defined solely by the claims. While some of the best modes and other examples for carrying out the present teachings have been described in detail, various alternative designs and aspects of the disclosure exist for practicing the present teachings defined in the appended claims.

What is claimed is:

1. A multi-phase power inverter for an electric propulsion system, the multi-phase power inverter comprising:

a plurality of X-type multilevel power converters arranged to transfer electric power between a high-voltage direct current (DC) power supply and an electric machine, wherein each of the plurality of X-type multilevel power converters is a solid-state integrated circuit (IC) including:

a first leg; and a second leg, each of the first leg and the second leg including:

a positive DC power bus;

a negative DC power bus;

a neutral bus;

a first alternating current (AC) bus;

a second AC bus;

a first conductive layer;

a second conductive layer; and wherein the first leg further includes:

a first plurality of semiconductor switches including a third semiconductor switch, a fourth semiconductor switch, a fifth semiconductor switch, and a sixth semiconductor switch;

a first clamping diode; and a first plurality of conductive spacers arranged between the fifth semiconductor switch and the positive DC power bus, the sixth semiconductor switch and the first AC bus, the fourth semiconductor switch and the second conductive layer, the third semiconductor switch and the second conductive layer, and the first clamping diode and the second conductive layer; and wherein the second leg further includes:

a second plurality of semiconductor switches including a first semiconductor switch, a second semiconductor switch, a seventh semiconductor switch, and an eighth semiconductor switch;

a second clamping diode;

a second plurality of conductive spacers arranged between the first semiconductor switch and the positive DC power bus; the second semiconductor switch and the second AC bus; the eighth semiconductor switch and the second conductive layer; the seventh semiconductor switch and the second conductive layer; and the second clamping diode and the second conductive layer; and wherein the first plurality of semiconductor switches, the first leg positive DC power bus, the first leg negative DC power bus, the first leg first AC bus, the first leg second AC bus, the first leg first conductive layer, the first leg second conductive layer, and the first clamping diode are arranged into a plurality of tiers including:

a first tier composed of the first leg first conductive layer arranged coplanar with the first leg first negative DC power bus that is arranged coplanar with the first leg second AC bus;

a second tier composed of the first clamping diode arranged coplanar with the third semiconductor switch arranged coplanar with the fourth semiconductor switch that is arranged coplanar with the fifth semiconductor switch that is arranged coplanar with the sixth semiconductor switch; and a third tier composed of first leg second conductive layer arranged coplanar with the first leg first positive DC power bus arranged coplanar the first leg first AC bus; and wherein the second plurality of semiconductor switches, the second leg positive DC power bus, the second leg negative DC power bus, the second leg first AC bus, the second leg second AC bus, the second leg first conductive layer, the second leg second conductive layer, and the second clamping diode are arranged into a plurality of tiers including:

a first tier composed of the second leg first conductive layer arranged coplanar with the second leg first negative DC power bus that is arranged coplanar with the second leg second AC bus;

a second tier composed of the second clamping diode arranged coplanar with the first semiconductor switch arranged coplanar with the second semiconductor switch that is arranged coplanar with the seventh semiconductor switch that is arranged coplanar with the eighth semiconductor switch; and a third tier composed of second leg second conductive layer arranged coplanar with the second leg first positive DC power bus arranged coplanar the second leg first AC bus; and wherein the first leg and the second leg are electrically connected by interconnections arranged between the first AC bus of the first leg and the first AC bus of the second leg, and the second AC bus of the first leg and the second AC bus of the second leg.

2. The multi-phase power inverter as recited in claim 1, further including:

a first heat sink; and a second heat sink;

a first power module substrate; and a second power module substrate; and wherein the first leg first conductive layer, the first leg negative DC power bus, and the first leg second AC bus are arranged adjacent to a first side of the first power module substrate;

wherein the first heat sink is arranged adjacent to a second side of the first power module substrate;

wherein the second leg first conductive layer, the second leg negative DC power bus, and the second leg second AC bus are arranged adjacent to a first side of the second power module substrate; and wherein the second heat sink is arranged adjacent to a second side of the second power module substrate.

3. The multi-phase power inverter as recited in claim 2, wherein the fifth semiconductor switch and the sixth semiconductor switch are arranged on a first portion of the first power module substrate;

wherein the first clamping diode, and a first plurality of gate/source pins are arranged on a second portion of the first power module substrate;

wherein the fourth semiconductor switch and the third semiconductor switch are arranged on a third portion of the first power module substrate;

wherein the first portion, the second portion, and the third portion of the first power module substrate are coplanar, the second portion being arranged between the first portion and the third portion;

wherein the first semiconductor switch and the second semiconductor switch are arranged on a first portion of the second power module substrate;

wherein the second clamping diode, and a second plurality of gate/source pins are arranged on a second portion of the second power module substrate;

wherein the eighth semiconductor switch and the seventh semiconductor switch are arranged on a third portion of the second power module substrate; and wherein the first portion, the second portion, and the third portion of the second power module substrate are coplanar, the second portion being arranged between the first portion and the third portion.

4. The multi-phase power inverter as recited in claim 3, wherein the first plurality of gate/source pins and the second plurality of gate/source pins are configured to pop out vertically from the first power module substrate and the second power module substrate respectively.

5. The multi-phase power inverter as recited in claim 4, wherein the first leg positive DC power bus, the first leg negative DC power bus, the second leg positive DC power bus, and the second leg negative DC power bus are arranged at a first end of the X-type multilevel power converter, and wherein the first leg first AC bus, the first leg second AC bus, the second leg first AC bus, and the second leg second AC bus are arranged at a second end of the X-type multilevel power converter.

6. The multi-phase power inverter as recited in claim 1, wherein each of the first plurality of semiconductor switches and the second plurality of semiconductor switches includes a single die.

7. The multi-phase power inverter as recited in claim 6, wherein each single die includes a vertical device.

8. The multi-phase power inverter as recited in claim 1, wherein each of the first plurality of semiconductor switches and the second plurality of semiconductor switches includes a plurality of dies.

9. The multi-phase power inverter as recited in claim 8, wherein each of the plurality of dies includes a vertical device.

10. A multi-phase power inverter for an electric propulsion system, the multi-phase power inverter comprising:

a plurality of X-type multilevel power converters arranged to transfer electric power between a high-voltage direct current (DC) power supply and an electric machine, wherein each of the plurality of X-type multilevel power converters is a solid-state integrated circuit (IC) including:

a first leg; and a second leg, each of the first leg and the second leg including:

a positive DC power bus;

a negative DC power bus;

a neutral bus;

a first alternating current (AC) bus;

a second AC bus;

a first conductive layer;

a second conductive layer; and wherein the first leg further includes:

a first plurality of semiconductor switches including a third semiconductor switch, a fourth semiconductor switch, a fifth semiconductor switch, and a sixth semiconductor switch;

a first clamping diode; and a first plurality of conductive spacers arranged between the first clamping diode and a first portion of the first conductive layer; and wherein the second leg further includes:

a second plurality of semiconductor switches including a first semiconductor switch, a second semiconductor switch, a seventh semiconductor switch, and an eighth semiconductor switch;

a second clamping diode; and a second plurality of conductive spacers arranged between the second clamping diode and the first conductive layer; and wherein the first plurality of semiconductor switches, the first leg positive DC power bus, the first leg negative DC power bus, the first leg first AC bus, the first leg second AC bus, the first leg first conductive layer, the first leg second conductive layer, and the first clamping diode are arranged into a plurality of tiers including:

a first tier composed of the first leg first AC bus arranged coplanar with the first leg second AC bus arranged coplanar with the first portion of the first leg first conductive layer that is arranged coplanar with the first leg positive DC power bus that is arranged coplanar with the first leg negative DC power bus;

a second tier composed of the first clamping diode arranged coplanar with the third semiconductor switch arranged coplanar with the fourth semiconductor switch that is arranged coplanar with the fifth semiconductor switch that is arranged coplanar with the sixth semiconductor switch; and a third tier composed of a second portion of the first leg first conductive layer; and wherein the second plurality of semiconductor switches, the second leg positive DC power bus, the second leg negative DC power bus, the second leg first AC bus, the second leg second AC bus, the second leg first conductive layer, the second leg second conductive layer, and the second clamping diode are arranged into a plurality of tiers including:

a first tier composed of the second leg first AC bus arranged coplanar with the second leg second AC bus arranged coplanar with the first portion of the second leg first conductive layer that is arranged coplanar with the second leg first positive DC power bus that is arranged coplanar with the second leg negative DC power bus;

a second tier composed of the second clamping diode arranged coplanar with the first semiconductor switch arranged coplanar with the second semiconductor switch that is arranged coplanar with the seventh semiconductor switch that is arranged coplanar with the eighth semiconductor switch; and a third tier composed of a second portion of the second leg first conductive layer; and wherein the first leg and the second leg are electrically connected by interconnections arranged between the first leg first AC bus and the second leg first AC bus, and the second leg second AC bus and the second leg second AC bus.

11. The multi-phase power inverter as recited in claim 10, further including:

a first heat sink; and a second heat sink;

a first power module substrate; and a second power module substrate; and wherein the first leg first conductive layer, the first leg negative DC power bus, and the first leg second AC bus are arranged adjacent to a first side of the first power module substrate;

wherein the first heat sink is arranged adjacent to a second side of the first power module substrate;

wherein the second leg first conductive layer, the second leg negative DC power bus, and the second leg second AC bus are arranged adjacent to a first side of the second power module substrate; and wherein the second heat sink is arranged adjacent to a second side of the second power module substrate.

12. The multi-phase power inverter as recited in claim 11, wherein the fifth semiconductor switch, the sixth semiconductor switch, and a first portion of a first plurality of gate/source pins are arranged on a first portion of the first power module substrate;

wherein the first clamping diode, and a second portion of the first plurality of gate/source pins are arranged on a second portion of the first power module substrate;

wherein the third semiconductor switch, the fourth semiconductor switch, and a third portion of the first plurality of gate/source pins are arranged on a third portion of the first power module substrate;

wherein the first portion, the second portion, and the third portion of the first power module substrate are coplanar, the second portion being arranged between the first portion and the third portion;

wherein the first semiconductor switch, the second semiconductor switch, and a first portion of a second plurality of gate/source pins are arranged on a first portion of the second power module substrate;

wherein the second clamping diode, and a second portion of the second plurality of gate/source pins are arranged on a second portion of the second power module substrate;

wherein the seventh semiconductor switch, the eighth semiconductor switch, and a third portion of the second plurality of gate/source pins are arranged on a third portion of the second power module substrate; and wherein the first portion, the second portion, and the third portion of the second power module substrate are coplanar, the second portion being arranged between the first portion and the third portion.

13. The multi-phase power inverter as recited in claim 12, wherein the first plurality of gate/source pins and the second plurality of gate/source pins are configured to pop out vertically from the first power module substrate and the second power module substrate respectively.

14. The multi-phase power inverter as recited in claim 13, wherein the first leg positive DC power bus, the first leg negative DC power bus, the second leg positive DC power bus, and the second leg negative DC power bus are arranged at a first end of the X-type multilevel power converter, and wherein the first leg first AC bus, the first leg second AC bus, the second leg first AC bus, and the second leg second AC bus are arranged at a second end of the X-type multilevel power converter.

15. The multi-phase power inverter as recited in claim 10, wherein each of the first plurality of semiconductor switches and the second plurality of semiconductor switches includes a single die.

16. The multi-phase power inverter as recited in claim 15, wherein each single die includes a lateral device.

17. The multi-phase power inverter as recited in claim 10, wherein each of the first plurality of semiconductor switches and the second plurality of semiconductor switches includes a plurality of dies.

18. The multi-phase power inverter as recited in claim 17, wherein each of the plurality of dies includes a lateral device.

19. A vehicle including an electric propulsion system, the vehicle comprising:

an electric propulsion system installed in a vehicle, the electric propulsion system including:

an electric motor configured to provide power to the electric propulsion system; and a multi-phase power inverter for an electric propulsion system, the multi-phase power inverter comprising:

a plurality of X-type multilevel power converters arranged to transfer electric power between a high-voltage direct current (DC) power supply and an electric machine, wherein each of the plurality of X-type multilevel power converters is a solid-state integrated circuit (IC) including:

a first leg; and a second leg, each of the first leg and the second leg including:

a positive DC power bus;

a negative DC power bus;

a neutral bus;

a first alternating current (AC) bus;

a second AC bus;

a first conductive layer;

a second conductive layer; and wherein the first leg further includes:

a first plurality of semiconductor switches including a third semiconductor switch, a fourth semiconductor switch, a fifth semiconductor switch, and a sixth semiconductor switch;

a first clamping diode; and a first plurality of conductive spacers arranged between the fifth semiconductor switch and the positive DC power bus, the sixth semiconductor switch and the first AC bus, the fourth semiconductor switch and the second conductive layer, and the third semiconductor switch and the second conductive layer; and wherein the second leg further includes:

a second plurality of semiconductor switches including a first semiconductor switch, a second semiconductor switch, a seventh semiconductor switch, and an eighth semiconductor switch;

a second clamping diode;

a second plurality of conductive spacers arranged between the first semiconductor switch and the positive DC power bus; the second semiconductor switch and the second AC bus; the eighth semiconductor switch and the second conductive layer; the seventh semiconductor switch and the second conductive layer; and the first clamping diode and the second conductive layer; and wherein the first plurality of semiconductor switches, the first leg positive DC power bus, the first leg negative DC power bus, the first leg first AC bus, the first leg second AC bus, the first leg first conductive layer, the first leg second conductive layer, and the first clamping diode are arranged into a first plurality of tiers;

wherein the second plurality of semiconductor switches, the second leg positive DC power bus, the second leg negative DC power bus, the second leg first AC bus, the second leg second AC bus, the second leg first conductive layer, the second leg second conductive layer, and the second clamping diode are arranged into a second plurality of tiers; and wherein the first leg and the second leg are electrically connected by interconnections arranged between the first AC bus of the first leg and the first AC bus of the second leg, and the second AC bus of the first leg and the second AC bus of the second leg.

20. The multi-phase power inverter for an electric propulsion system as recited in claim 19, wherein each of the first plurality of semiconductor switches includes a plurality of dies.

* * * * *